(12) United States Patent
Koike et al.

(10) Patent No.: US 6,604,417 B1
(45) Date of Patent: **\*Aug. 12, 2003**

(54) FLOW SENSOR AND STRAINER INTEGRATED FLOWMETER

(75) Inventors: Atsushi Koike, Saitama (JP); Kiyoshi Yamagishi, Saitama (JP); Kenichi Hiraizumi, Saitama (JP); Takayuki Takahata, Tokyo (JP)

(73) Assignee: Mitsui Mining & Smelting Co., Ltd., Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 09/763,290

(22) PCT Filed: Aug. 16, 1999

(86) PCT No.: PCT/JP99/04406

§ 371 (c)(1),
(2), (4) Date: Feb. 20, 2001

(87) PCT Pub. No.: WO00/11436

PCT Pub. Date: Mar. 2, 2000

(30) Foreign Application Priority Data

| Aug. 18, 1998 | (JP) | 10/231771 |
| Sep. 10, 1998 | (JP) | 10/257242 |
| Nov. 17, 1998 | (JP) | 10/326740 |

(51) Int. Cl.[7] ............................................. G01F 1/684
(52) U.S. Cl. ................................................... 73/204.22
(58) Field of Search .......................... 73/204.22, 204.26, 73/202.5

(56) References Cited

U.S. PATENT DOCUMENTS 5,596,969 A * 1/1997 Lipinski ..................... 123/494
5,936,157 A * 8/1999 Yamashita et al. ........ 73/204.26

FOREIGN PATENT DOCUMENTS

| JP | 1-219521 | 9/1989 |
| JP | 6-66614 | 3/1994 |
| JP | 8-146026 | 6/1996 |
| JP | 8-159840 | 6/1996 |
| JP | 9-269253 | 10/1997 |
| JP | 3050250 | 4/1998 |

* cited by examiner

Primary Examiner—Hezron Williams
Assistant Examiner—Corey D. Mack
(74) Attorney, Agent, or Firm—Baker & Daniels

(57) ABSTRACT

A strainer integrated flowmeter 210 is constituted by a strainer section 203 provided with a housing 202 having a flow passage 207 formed therein, a filter member 209 and a filter member insertion cylinder 210; and a flowmeter section 204 provided with a housing 202 having a flow passage 208 formed therein and a flow rate sensor 226. The housings 202 of both the strainer section 203 and flowmeter section 204 are integrated, and the flowmeter section 204 is disposed at downstream side. A vent hole 215 is formed in the housing 202 so as to be in communication with the flow passage 207.

28 Claims, 22 Drawing Sheets

F I G. 1
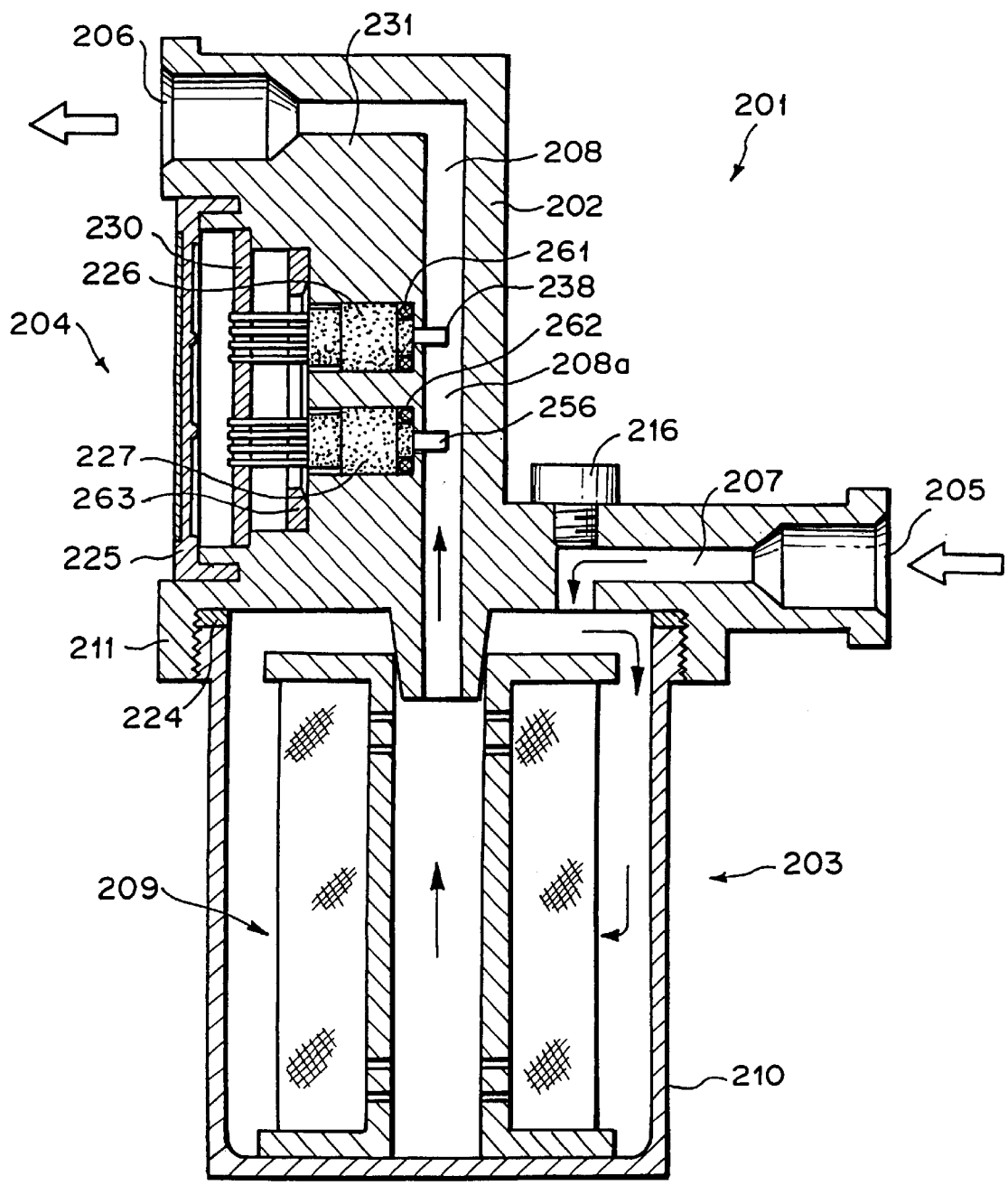

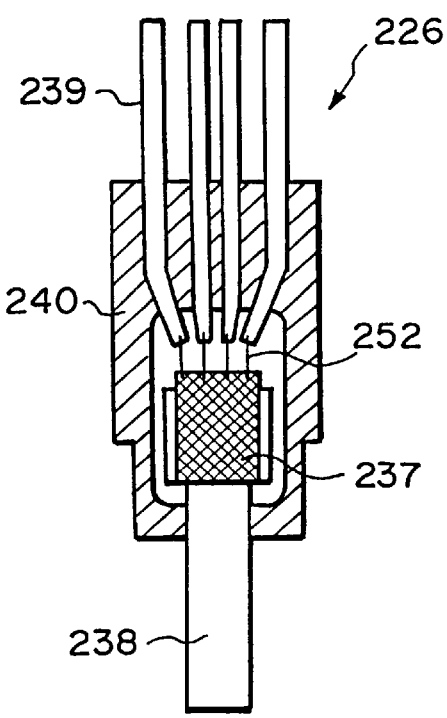
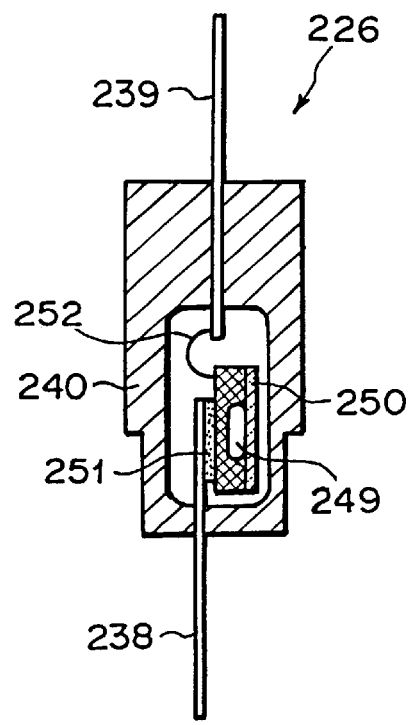
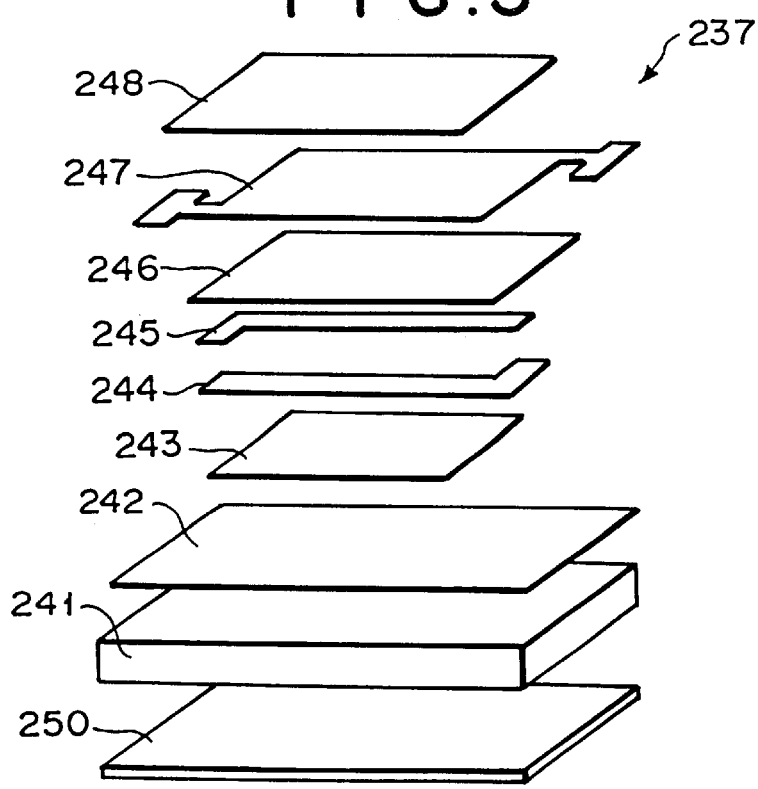

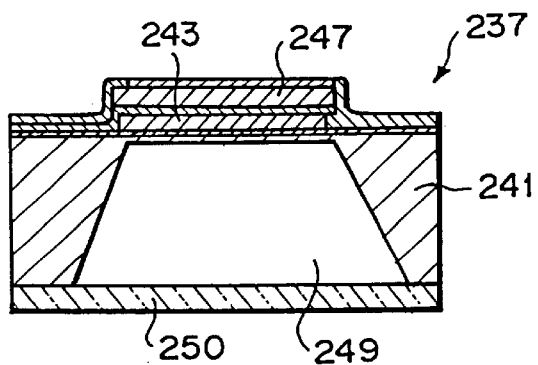
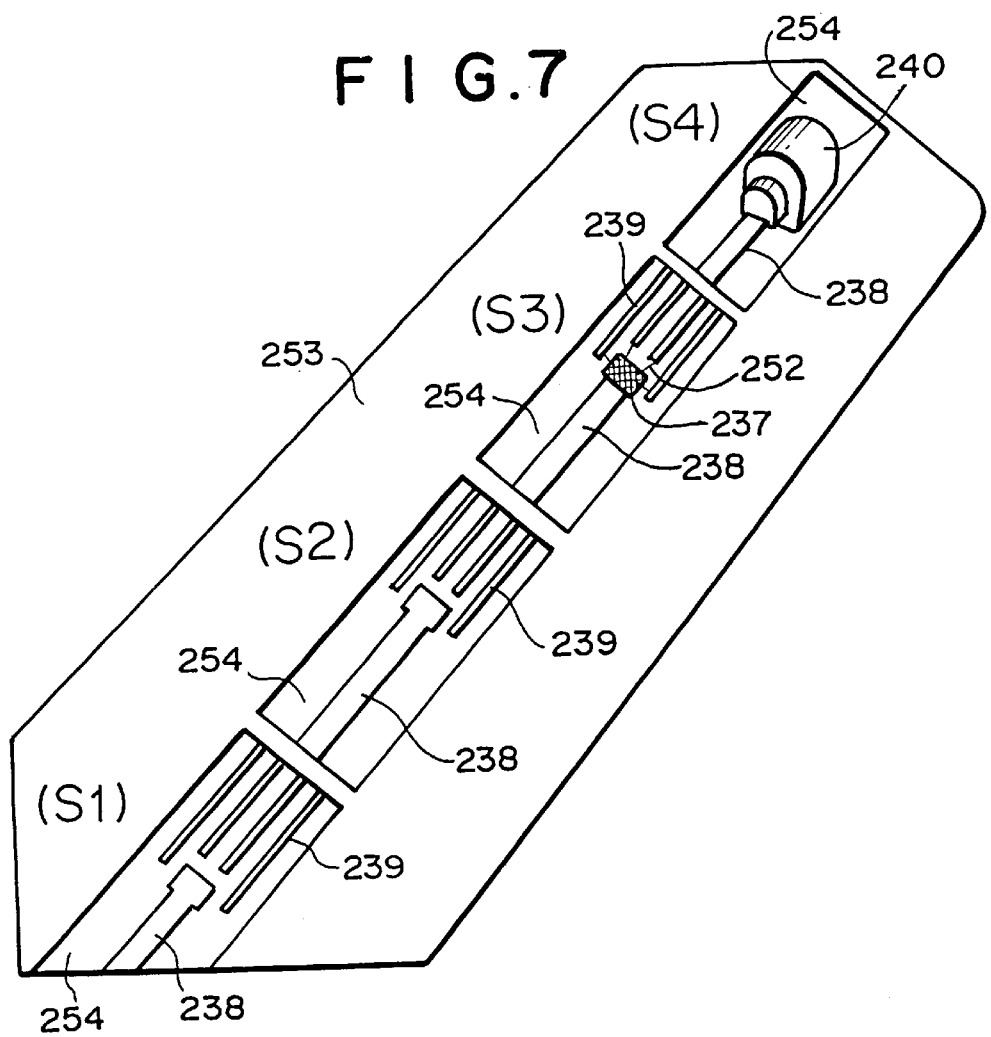

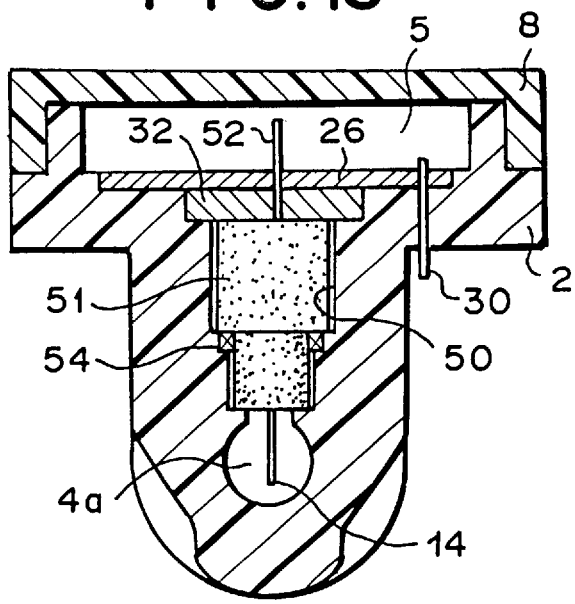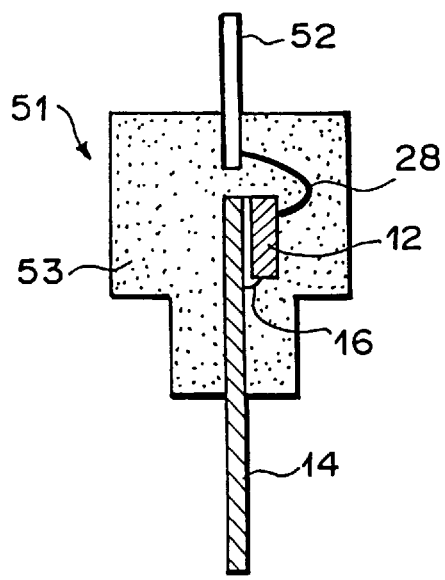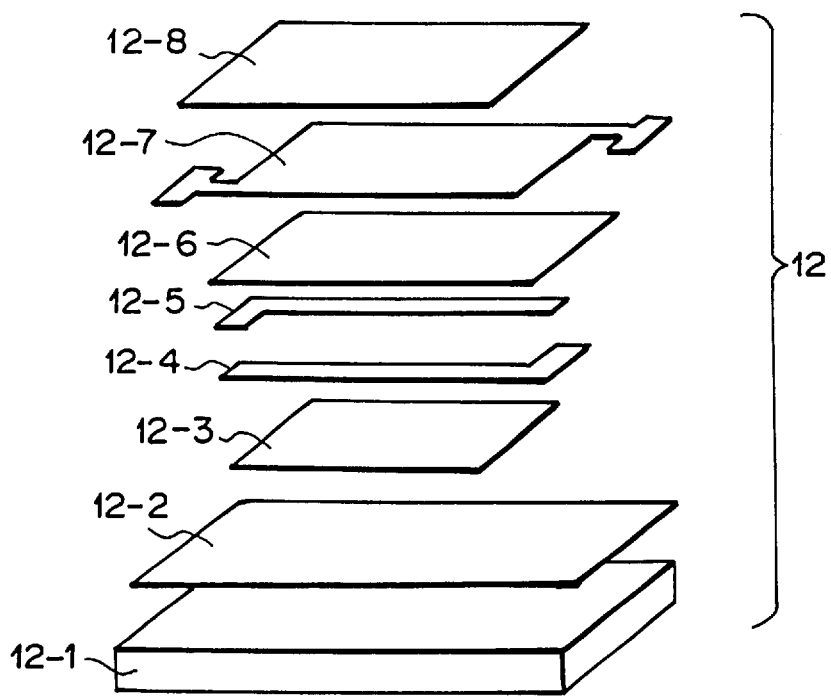

FLOW SENSOR AND STRAINER INTEGRATED FLOWMETER

BACKGROUND OF THE INVENTION (1) Field of the Invention

The present invention belongs to a fluid flow rate detection technology, and particularly relates to a flow rate sensor for detecting the flow rate of fluid flowing in a pipe line. The present invention intends to enhance the detecting accuracy of the flow rate sensor.

Further, the present invention relates to a strainer-integrated portable flowmeter which can be mounted on a pipe line through which kerosene is supplied to a kerosene burning apparatus such as a stove, boiler or the like to measure the flow rate of kerosene while removing a foreign matters such as dust or the like.

(2) Description of the Related Art

Various types of sensors have been hitherto used as a flow rate sensor (or flow velocity sensor) for measuring the flow rate (or flow velocity) of various fluid, particularly liquid, and a so-called thermal (particularly indirectly heated type) flow rate sensor is used because the cost can be easily reduced.

A sensor in which a thin-film heating element and a thin-film temperature sensing element are laminated through an insulating layer on a substrate and the substrate and the fluid in the pipe line are thermally connected to each other is used as an indirectly heated type flow rate sensor. By passing current through the heating element, the temperature sensing element is heated to vary the electrical characteristic of the temperature sensing element such as the value of the electrical resistance of the temperature sensing element. The electrical resistance value (varied on the basis of the temperature increase of the temperature sensing element) is varied in accordance with the flow rate (flow velocity) of fluid flowing in the pipe line. This is because a part of the heating value of the heating element is transferred through the substrate into the fluid, the heating value diffusing into the fluid is varied in accordance with the flow rate (flow velocity) of the fluid, and the heating value to be supplied to the temperature sensing element is varied in accordance with the variation of the heating value diffusing into the fluid, so that the electrical resistance value of the temperature sensing element is varied. The variation of the electrical resistance value of the temperature sensing element is also varied in accordance with the temperature of the fluid. Therefore, a temperature sensing device for temperature compensation is installed in an electrical circuit for measuring the variation of the electrical resistance value of the temperature sensing element to suppress the variation of the flow-rate measurement value due to the temperature of the fluid at maximum.

An indirectly heated type flow rate sensor using thin film elements as described above is disclosed in JP-08-146026 (A), for example.

The conventional indirectly heated type flow rate sensor is secured to a linear pipe line portion so that the substrate of a flow rate detector or a casing which is thermally connected to the substrate is exposed from the wall surface of the pipe line to the fluid.

When the fluid is viscous fluid, particularly liquid, the flow-velocity distribution on the section perpendicular to the flow of the fluid in the pipe line becomes ununiform (there is a great difference in flow velocity between the center portion and the outer peripheral portion on the section). In the case of the conventional sensor in which the substrate or the casing portion connected to the substrate is merely exposed to the fluid at the wall of the pipe line, the flow-velocity distribution has a great effect on the precision of the flow-rate measurement. This is because the flow velocity of the fluid flowing at the center portion on the section of the pipe line is not taken into consideration, but only the flow velocity of the fluid in the neighborhood of the wall of the pipe line is taken into consideration. As described above, the conventional flow rate sensor has such a problem that it is difficult to measure the flow rate of fluid accurately when the fluid is viscous fluid. Even when fluid has low viscosity at room temperature, it induces a problem connected to the above viscosity problem because the viscosity of the fluid increases as the temperature is lowered.

The flow rate sensor is required to be used under an extremely broad temperature environment in accordance with a geographical condition, an indoor or outdoor condition, etc. Further, these conditions are added with a season condition, a day or night condition, etc., and the temperature environment is greatly varied. Therefore, there has been required a flow rate sensor which can detect the flow rate accurately under such a broad environmental temperature condition as described above.

As mentioned in the above, the temperature sensing device for temperature compensation is installed in the measuring electrical circuit. However, it is insufficient for suppressing the variation of the flow-rate measurement value due to the temperature of the fluid. Accordingly, it is required to furthermore reduce the temperature dependence of the detected flow rate value to enhance the detecting precision.

Therefore, an object of the present invention is to provide a flow rate sensor which can accurately measure the flow rate of fluid flowing in a pipe line even when the fluid is viscous fluid.

Further, an object of the present invention is to provide a flow rate sensor which can accurately measure the flow rate of the viscous fluid flowing in a pipe line under a broad environmental temperature condition on the basis of lowering the temperature dependence of the detected flow rate value.

Further, a kerosene burning apparatus such as a stove, boiler or the like burns kerosene and produces heat to increase the temperature of air and heat the inside of a room, to heat and boil a large amount of water and to produce high-pressure steam serving as a driving source.

In a boiler 401 shown in FIGS. 27, 28A and 28B, kerosene is supplied from a tank 402 through a pipe line 403, and then burned by a burner 404 while sprayed. By using heat produced at this time, a large amount of water is boiled or high-pressure steam is produced, and the combustion gas is discharged from a funnel 405.

Further, a strainer 407 for removing foreign matter such as dust, motes, etc. is disposed between the tank 402 and the pump 406, and a flowmeter 408 for measuring the flow rate of kerosene is disposed between the pump 406 and the burner 404.

However, when minute foreign matters passing through the strainer 407 are gradually accumulated or foreign matters invade between the strainer 407 and the burner 404, these foreign matters cannot be removed and the foreign matters invade into the nozzle 409 of the burner 404, thereby closing a part of the discharge port 409a.

In such a case, the amount of kerosene passing through the nozzle 409 is reduced and thus the burner 404 cannot exhibit its sufficient performance, resulting in reduction of the heat value produced in the boiler 401. Further, since kerosene is incompletely burned (combusted), the energy held by the kerosene is vainly dissipated to produce incomplete combustion gas such as carbon monoxide or the like, which causes air pollution.

In order to solve the above problem, there has been proposed an air fuel ratio control method for measuring the flow rate of kerosene flowing in a pipe line 403 with a flowmeter 408 disposed in the pipe line and supplying a suitably amount of air corresponding to the measurement value to burn kerosene.

According to this method, even when a part of the discharge port 409a of the nozzle 409 is closed, no incomplete combustion occurs and thus the vain consumption of the holding energy of kerosene and the air pollution due to the incomplete combustion can be prevented. If the foreign matters in the nozzle 409 is jetted from the discharged port 409a under jetting pressure of kerosene or the like, the burner 404 can exhibits its inherent performance and the heating value of the boiler 401 is restored to its normal value.

When conducting the air fuel ratio control method, it is necessary to detect the flow rate of the kerosene flowing through the pipe line 403 by means of the flowmeter 408 disposed in the pipe line. However, since the flowmeter 408 is disposed downstream away from the strainer 407 with a considerable interval, the minute foreign matters passed through the strainer 407 is accummulated, and the foreign matters invades the pile line between the strainer 407 and the flowmeter 408. When these foreign matters invades the inside of the flowmeter 408 to be fixed to and accummulated on O-ring at the sensor mount portion for example, a gap is formed there to cause leak of the kerosene. If the foregn matters are fixed to and accummulated on the fin plate of the sensor, an area of the fin plate used for heat conduction is reduced and a detail of the kerosene flow around the fin plate is changed to thereby cause significant lowering of the detection accuracy of the flowmeter.

In such cases, it is necessary to remove the flowmeter 408 from the pipe line, perform cleaning treatment of the flowmeter 408 or change the defective parts to a fresh one, and then attach the flowmeter 408 to the pipe line again. However, air remains in the pipe line when the flowmeter 408 is attached thereto again, and therefore air bubbles are formed to remain in the pipe line at the upper side thereof if the kerosene is flown in the pipe line. If the air bubbles are fixed to the heat transfer member of the sensor, the heat transferring manner through the heat transfer member is changed to cause significant lowering of the detection accuracy of the flowmeter 408.

According to the air fuel ratio control method, the incomplete combustion can be prevented, however, the reduction of the heating value produced in the boiler 301 cannot be prevented. Further, if foreign matters in the nozzle 309 are not discharged from the discharge port 309a, they must be artificially removed. However, in the conventional flowmeter 408, an operator cannot recognize the flow rate of the kerosene directly so that the operation al work of removing the foreign matters from the inside of the nozzle 409 cannot be conducted immediately.

The present invention has been implemented to solve the above problems, and has an object to provide a strainer integrated flowmeter which is hardly invaded by the foreign matters, does not permit the remaining of the air in the pipe line, can measure the flow rate of fluid such as kerosene passing through the pipe line accurately over long duration, and make it possible for the operator to recognize the flow rate of the fluid such as kerosene directly.

SUMMARY OF THE INVENTION

In order to attain the above object, according to the present invention, there is provided a strainer integrated flowmeter comprising a strainer section provided with a housing having a flow passage formed therein, a filter member and a filter member insertion cylinder; and a flowmeter section provided with a housing having a flow passage formed therein and a flow rate sensor, wherein the housing of the strainer section and the housing of the flowmeter section are integrated, and the flowmeter section is disposed downstream the strainer section.

In order to prevent the air bubbles from remaining at the upper side of the flow passage, it is preferable to form a vent hole in the integrated housing so as to be in communication with the flow passage formed in the integrated housing.

In order for the operator to immediately recognize the flow rate value of the fluid such as kerosene, it is preferable that the flowmeter section is provided with a display portion for indicating a flow rate value, an operating portion for supplying electric power and detecting a flow rate, and an electric circuit for driving the display portion to indicate the flow rate value detected by the flow rate sensor.

In order to perform highly sensitive flow rate detection, it is preferable that the flow rate sensor comprises a flow rate detector having a heating element and a temperature sensing element both formed on a substrate; a fin plate through which heat is transferred to/from a fluid; and an output terminal for outputting a voltage value corresponding to the flow rate, and, said flow rate detector, a portion of the fin plate and a portion of the output terminal are sealed with molding.

In order to reduce the error in the detected flow rate value due to the temperature of the fluid such as kerosene, it is preferable that the flowmeter section is provided with a temperature sensor for detecting a temperature of fluid.

In order to perform highly sensitive temperature detection, it is preferable that the temperature sensor comprises a temperature detector having a temperature sensing element formed on a substrate; a temperature sensor fin plate through which heat is transferred to/from said fluid; and a temperature sensor output terminal for outputting a voltage value corresponding to the temperature, and, the temperature detector, a portion of the temperature sensor fin plate and a portion of the temperature sensor output terminal are sealed with molding.

The detected flow rate value can be indicated digitally on the display portion in case that the electric circuit comprises the temperature sensing element of the flow rate sensor, the temperature sensing element of the temperature sensor, and a bridge circuit which output a voltage difference corresponding to the flow rate of the fluid, wherein the electric circuit further comprises a V/F conversion circuit for converting the voltage difference corresponding to the flow rate of the fluid to a pulse signal having corresponding frequency, a counter for counting number of pulse of the pulse signal, and a microcomputer for converting output of the counter to a flow rate value corresponding to the frequency.

According to the present invention, in order to attain the above object, there is provided a flow rate sensor comprising a flow rate detector having a heating function and temperature sensing function; a fluid-flowing pipe line for a fluid to be detected; and a flow rate detecting heat transfer member disposed so as to be affected by a heat generated in the flow rate detector and extend into the inside of the pipe line, wherein temperature sensing which is affected by a heat absorption effect of the fluid due to the heat through the flow rate detecting heat transfer member is executed in the flow rate detector, and a flow rate of the fluid in the pipe line is detected on the basis of result of the temperature sensing, wherein the pipe line has a fluid inflow side portion, a fluid out flow side portion and a center portion positioned between the fluid inflow side portion and fluid outflow side portion, the flow rate detecting heat transfer member extends into the inside of the pipe line at the center portion, and an inner diameter of the center portion is smaller than that of the fluid inflow side portion.

In an aspect of the invention, the inner diameter of the center portion is 50–80% of the inner diameter of the fluid inflow side portion.

In an aspect of the invention, the inner diameter of the fluid outflow side portion is substantially equal to the inner diameter of the fluid inflow side portion.

In an aspect of the invention, an intermediate portion is formed between the center portion and the fluid inflow side portion, the intermediate portion having a continuously varying inner diameter and a length of a half or less of a difference between the inner diameter of the fluid inflow side portion and the inner diameter of the center portion.

In an aspect of the invention, the flow rate detecting heat transfer member is disposed at a position separated from a fluid inflow side edge of the center portion by 4 times or less of the inner diameter of the center portion.

In an aspect of the invention, the flow rate detector comprises a thin-film heating element and a flow rate detecting thin-film temperature sensing element disposed so as to be affected by the effect of the heating of said thin-film heating element, the thin-film heating element and the flow rate detecting thin-film temperature sensing element being formed on the flow rate detecting heat transfer member at an outside of the pipe line.

In an aspect of the invention, the flow rate detecting heat transfer member has a shape of plate and is arranged in parallel to a fluid-flowing direction in the pipe line.

In an aspect of the invention, the flow rate sensor further comprises a fluid temperature detector for use in thermal compensation of flow rate detection, and a fluid temperature detecting heat transfer member extending into the inside of the pipe line, wherein the fluid temperature detector and the fluid temperature detecting heat transfer member are thermally connected to each other.

In an aspect of the invention, the fluid temperature detecting heat transfer member is disposed in the center portion of the pipe line at a fluid outflow side of the flow rate detecting heat transfer member.

In an aspect of the invention, the fluid temperature detecting heat transfer member has a shape of plate and is arranged in parallel to a fluid-flowing direction in the pipe line.

According to the present invention, in order to attain the above object, there is provided a flow rate sensor comprising a flow rate detector having a heating function and temperature sensing function; a fluid-flowing pipe line for a fluid to be detected; and a flow rate detecting heat transfer member disposed so as to be affected by a heat generated in the flow rate detector and extend into the inside of the pipe line, wherein temperature sensing which is affected by a heat absorption effect of the fluid due to the heat through the flow rate detecting heat transfer member is executed in the flow rate detector, and a flow rate of the fluid in the pipe line is detected on the basis of result of the temperature sensing, wherein the flow rate detecting heat transfer member is exposed to an inside of the pipe line only at a central area located from a center line of the pipe line to a radial position of 80% or less of a radial interval between the center line and an inner surface of the pipe line.

In an aspect of the invention, the flow rate detecting heat transfer member extends into the pipe line in a radial direction thereof so that a tip end thereof is positioned in the central area, and a base of a portion of the flow rate detecting heat transfer member which is disposed in the pipe line but outside the central area is sealed with a heat insulation member.

In an aspect of the invention, the flow rate detector and a portion of the flow rate detecting heat transfer member thermally connected to the flow rate detector are accommodated within a base portion having heat insulation property, and the heat insulation member is constituted by a part of the base portion.

In an aspect of the invention, the base portion and the heat insulation member are made of synthetic resin.

In an aspect of the invention, the flow rate detector comprises a thin-film heating element and a flow rate detecting thin-film temperature sensing element disposed so as to be affected by the effect of the heating of the thin-film heating element, said thin-film heating element and a flow rate detecting thin-film temperature sensing element being formed on the flow rate detecting heat transfer member at an outside of the pipe line.

In an aspect of the invention, the flow rate detecting heat transfer member has a shape of plate and is arranged in the pipe line along a direction thereof.

In an aspect of the invention, the flow rate sensor further comprises a fluid temperature detector for use in thermal compensation of flow rate detection, and a fluid temperature detecting heat transfer member extending into the inside of the pipe line, wherein the fluid temperature detector and the fluid temperature detecting heat transfer member are thermally connected to each other.

In an aspect of the invention, the temperature detecting heat transfer member is exposed to the inside of the pipe line only at the central area.

In an aspect of the invention, the temperature detecting heat transfer member extends into the pipe line in a radial direction thereof so that a tip end thereof is positioned in the central area, and a base of a portion of the temperature detecting heat transfer member which is disposed in the pipe line but outside the central area is sealed with a heat insulation member.

In an aspect of the invention, the temperature detector and a portion of the temperature detecting heat transfer member thermally connected to the temperature detector are accommodated within a base portion having heat insulation property, and the heat insulation member is constituted by a part of the base portion.

In an aspect of the invention, the temperature detecting heat transfer member has a shape of plate and is arranged in the pipe line along a direction thereof.

BRIEF DESCRIPTION OF THE DRAWINGS

FIG. 1 is a longitudinal, cross-sectional view showing an embodiment of a strainer integrated flowmeter according to the present invention;

FIGS. 4A and 4B are a frontal, cross-sectional view and side cross-sectional view showing a flow rate sensor, respectively;

FIG. 5 is an exploded perspective view showing a flow rate detector of the flow rate sensor;

FIG. 6 is a longitudinal, sectional view showing the flow rate detector of the flow rate sensor;

FIG. 7 is an explanatory diagram showing a manufacturing process of the flow rate sensor;

FIG. 13 is a cross-sectional view taken perpendicularly to the fluid-flowing pipe line showing the embodiment of the flow rate sensor according to the present invention;

FIG. 14 is a cross-sectional view showing a flow rate detecting unit of the embodiment of the flow rate sensor according to the present invention;

FIG. 15 is an exploded perspective view showing a flow rate detector of the embodiment of the flow rate sensor according to the present invention;

PREFERRED EMBODIMENTS FOR EXECUTING THE INVENTION

Embodiments of the present invention will be described with reference to the drawings.

Figure 2:
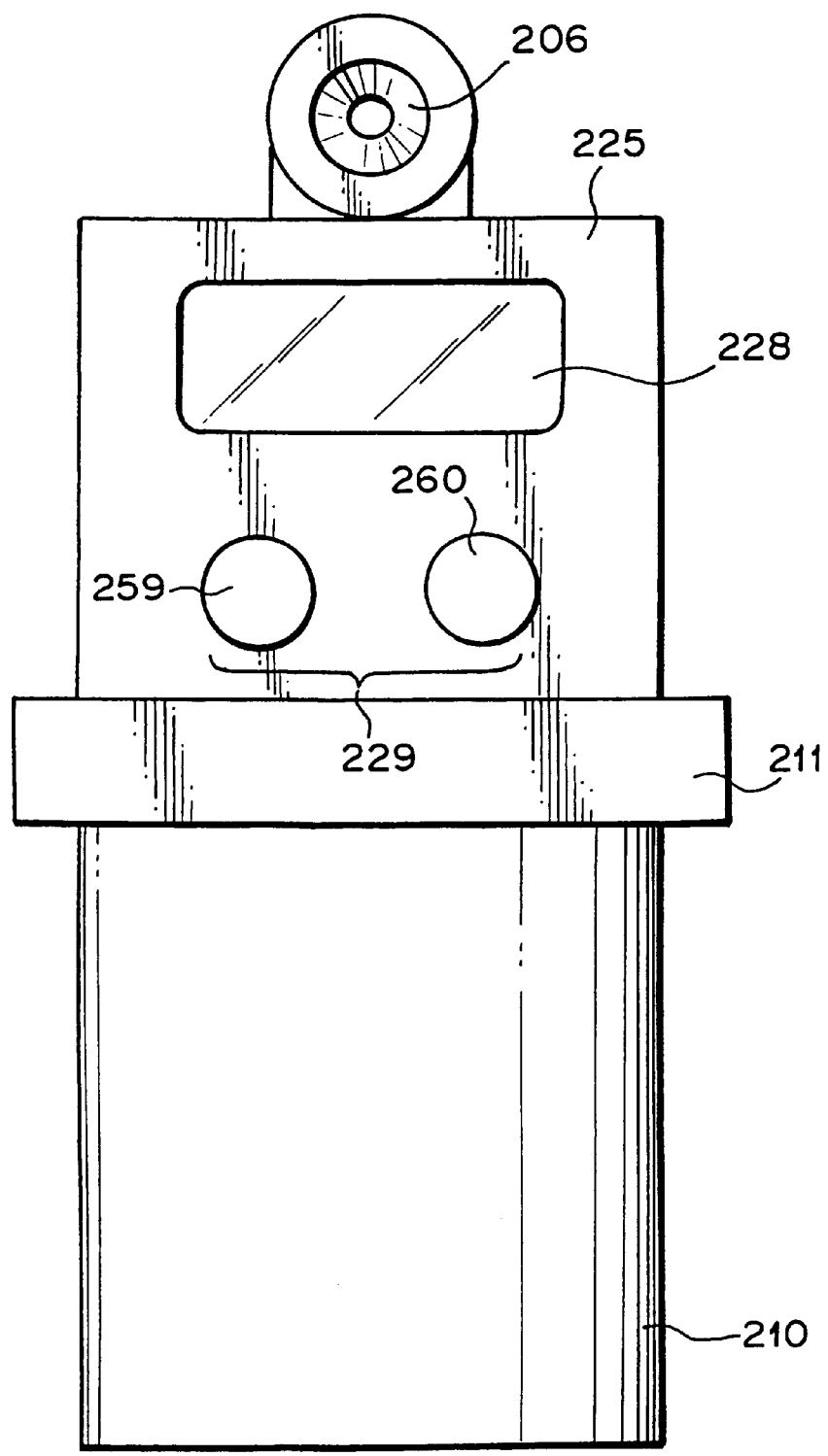
FIG. 2 is a side view showing the embodiment of the strainer integrated flowmeter according to the present invention.
Figure 3:
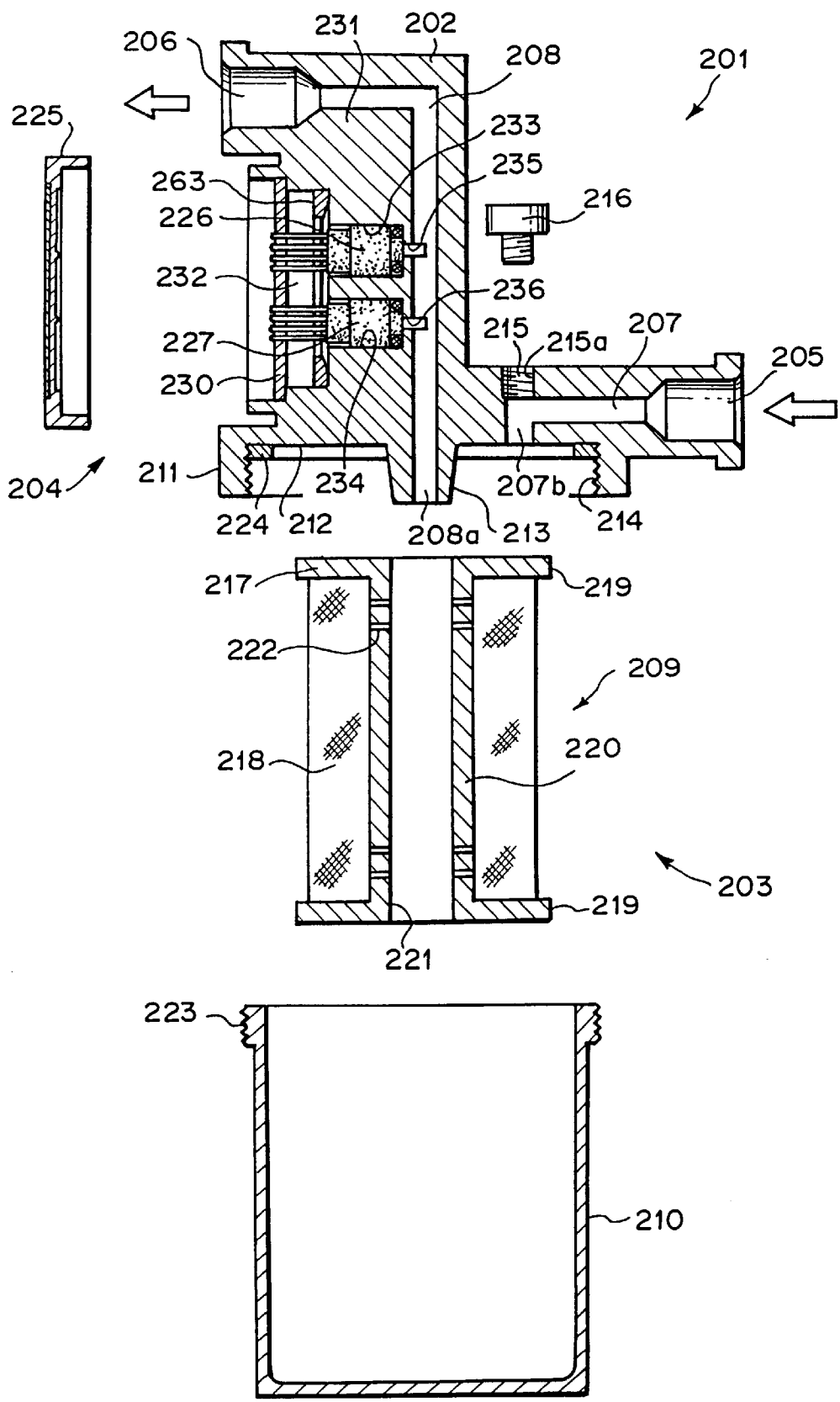
FIG. 3 is an exploded, longitudinal, cross-sectional view showing the embodiment of the strainer integrated flowmeter according to the present invention.

FIGS. 1 to 3 show an embodiment of a strainer integrated flowmeter according to the present invention. As shown in these figures, a strainer section 203 and a flowmeter section 204 are integrated to each other so as to share a housing 202 with each other.

The housing 202 is manufactured by casting (die casting) of aluminum, zinc, tin alloy, etc. Both the end portions of the housing 202 are designed as connection portions 205, 206 for connecting the external pipe lines, and an inflow side flow passage 207 and outflow side flow passage 208 are provided in the housing 202.

The strainer section 203 comprises a lower half portion of the housing 202, filter member 209 and filter member insertion cylinder 210.

On the half portion of the housing 202, there is formed a cylinder connectiong portion 211 slightly protruding downwards. A connecting recess portion 212 is formed At the inside of the cylinder connectiong portion 211. An engagement protrusion 213 is formed at the center of the connecting recess portion 212, and a female screw 214 is formed at the inward peripheral surface of the connecting recess portion 212.

On the upper surface of the connecting recess portion 212, a vertical portion 207b of the inflow side flow passage 207 forms an opening. On the lower end face of the engagement protrusion 213, a vertical portion 208a of the outflow side flow passage 208 forms an opening. A vent hole 215 is connected to the upper side of the vertical portion 207b of the inflow side flow passage 207. The vent hole 215 has a female screw 215a formed therein, with which a sealing member 216 engages.

The filter member 209 comprises a retainer 217 and filter 218. The retainer 217 is manufactured by casting (die casting) of aluminum, zinc, tin alloy, etc. In the retainer 217, flange portions 219, 219 at both ends are connected to each other by a connecting portion 220 which has a through-hole 221 at the center thereof and a many communication holes each having small inner diameter. The filter 218 is a non-woven fabric of glass fiber, plastic fiber, etc., and is attached to the outer surface of the connecting portion 220 of the retainer 217.

The filter member insertion cylinder 210 is manufactured by casting (die casting) of aluminum, zinc, tin alloy, etc. A male screw 223 is formed on the outer surface of the upper portion of the filter member insertion cylinder 210. The filter member 209 is disposed on the center of the bottom portion of the filter member insertion cylinder 210, the male screw 223 is engaged with the female screw 214 of the connecting recess portion 212, and the upper end face of the filter member insertion cylinder 210 is made in contact with the upper surface of the connecting recess portion 212 via a sealing member 224 having a ring shape of small thickness. Thus the upper end opening of the through-hole 221 of the filter member 209 is sealed with the engagement protrusion 213, and the setting of filter member 209 is completed.

The kerosene is made to flow through the flow passage, and the sealing member 216 is made to engage with the vent hole 215 after ascertaining no remaining air in the flow passage.

The kerosene flowing through the inflow side flow passage 207 of the housing 202 is introduced into the filter member insertion cylinder 210 through the opening of the vertical portion 207*a*. In the filter member insertion cylinder 210, the kerosene flows downwards on the inward peripheral surface, and then collected on the bottom portion.

During kerosene's passing through the filter 218, the foreign matters such as dusts, etc. contained in the kerosene are removed therefrom. Then the kerosene is introduced into the through-hole 221 through the communication holes 222 of the retainer 217, into the outflow side flow passage 208 via the opening of the vertical portion 208*a* thereof, and then into the flowmeter section 204.

The flowmeter section 204 comprises an upper half portion of the housing 202, lid 225, flow rate sensor 226, temperature sensor 227, display portion 228, operating portion 229 and circuit substrate 230.

On the upper half portion of the housing 202, there is formed a sensor attaching portion 231 at the lefthand side thereof. A sensor setting space 232 is formed at the lefthand side of the sensor attaching portion 231, and sensor insertion holes 233, 234 are formed so as to communicate both the sensor setting space 232 and the outflow side flow passage 208. Openings 235, 236 are formed at the positions corresponding to the sensor insertion holes 233, 234 of the vertical portion 208*a* of the outflow side flow passage 208, respectively.

The lid 225 is manufactured by casting (die casting) of aluminum, zinc, tin alloy, etc. The lid 225 is detachably attached to the lefthand portion of the sensor attaching portion 231.

The flow rate sensor 226 comprises a flow rate detector 237, fin plate 238, output terminals 239 and sealing member 240, as shown in FIGS. 4A and 4B.

As shown in FIG. 5, the flow rate detector 237 is designed in a chip structure by forming an insulating layer 242, thin-film heating element 243, electrode layers 244, 245, insulating layer 246, thin-film temperature sensing element 247 and insulating layer 248 in this order on a substrate 241.

The substrate 241 is formed of a rectangular plate of silicon, alumina or the like which has a thickness of 600 $\mu$m and a size of about 2×3 mm. As shown in FIG. 6, a recess portion 249 having a depth of 550 $\mu$m is formed by etching or the like from the opposite surface of the substrate to the surface on which the heating element 243 and the temperature sensing element 247 are laminated. A glass plate 250 having a thickness of 50 to 200 $\mu$m is fixed to the opposite surface of the substrate 241 to the surface on which the heating element 243 and the temperature sensing element 247 are laminated to completely seal the recess portion 249.

The heating element 243 is formed of cermet which has a thickness of about 1 $\mu$m and is designed in a desired shape by patterning, and the electrode layers 244, 245 are formed of nickel at a thickness of about 0.5 $\mu$m or formed of a lamination film obtained by laminating a gold film of about 0.5 $\mu$m on a nickel film of about 0.5 $\mu$m. The temperature sensing element 247 has a thickness of about 0.5 to 1 $\mu$m and is formed of a metal resistant film of platinum, nickel or the like which is patterned in a desired shape, for example, a meandering shape and has a large and stable resistance-temperature coefficient, or an NFC thermistor of manganese oxide. The insulating layers 242, 246, 248 are formed of $SiO_2$ at a thickness of about 1 $\mu$m.

The fin plate 238 is formed of material having excellent thermal conductivity such as copper, duralumin, copper-tungsten alloy or the like, and it is a rectangular thin plate of 200 $\mu$m in thickness and about 2 mm in width.

As shown in FIGS. 4A and 4B, the flow rate detector 237 is fixed to the surface of the upper end portion of the fin plate 238 through a joint member 251 of silver paste or the like so that the surface of the flow rate detector 237 on which the heating element 243 and the temperature sensing element 247 are laminated is confronted to the surface of the upper end portion of the fin plate 238. The flow rate detector 237 is connected to the output terminal 239 by a bonding wire 252, and the flow rate detector 237, the upper half portion of the fin plate 238 and the lower half portion of the output terminal 239 are sealed with the sealing member 240 formed by molding.

Various methods may be used to manufacture the flow rate sensor 226, and the fin plate 238 and the output terminal 239 may be unified.

For example, the following process may be adopted. As shown in FIG. 7, there are successively carried out a step of etching a plate 253 to form a plate base member 254 having a predetermined shape (S1), a step of conducting silver plating treatment on a portion to which the flow rate detector 237 will be joined (S2), a step of coating silver paste on the portion to fix the flow rate detector 237 to the portion, connecting the flow rate detector 237 and the output terminal 239 by a bonding wire 252 and conducting nickel plating on the portion corresponding to the fin plate 238 (S3), and a step of molding the sealing member 240 with epoxy resin to seal the flow rate detector 237, the upper half portion of the fin plate 238 and the lower half portion of the output terminal 239 (S4), thereby obtaining the flow rate sensor 226 as shown in FIGS. 4A and 4B.

The temperature sensor 227 has the construction similar to the flow rate sensor 226, and comprises a temperature detector obtained by removing the heating element 243, the electrode layers 244, 245 and the insulating layer 246 from the flow rate detector 237 of the flow rate sensor 226, a fin plate 256, and output terminals and sealing member similar to those of the flow rate sensor 226. The same method as the flow rate sensor 226 may be used as a method of manufacturing the temperature sensor 227.

In the flow rate sensor 226, the temperature sensing element 247 is heated by supplying current to the heating element 243, and the variation of the electrical resistance value of the temperature sensing element 247 is detected. Here, since the flow rate sensor 226 is disposed on the outflow side flow passage 208, a part of the heating value of the heating element 243 is dissipated through the fin plate 238 into kerosene flowing in the outflow side flow passage 208, and the heating value transferred to the temperature sensing element 247 is equal to a value obtained by subtracting the dissipated heating value into the kerosene from the heating value of the heating element 243. Since the dissipated heating value is varied in accordance with the flow rate of the kerosene, the flow rate of the kerosene flowing in the outflow side flow passage 208 can be measured by detecting the variation of the electrical resistance value of the temperature sensing element 247 varying in accordance with the heating value to be supplied thereto.

Further, since the dissipated heating value is varied in accordance with the temperature of the kerosene, as shown in FIG. 3, the temperature sensor 227 is disposed at a proper position of the outflow side flow passage 208, and a temperature compensating circuit is added in the flow rate detection circuit for detecting the variation of the electrical resistance value of the temperature sensing element 247 to thereby suppress the error of the flow rate measurement value due to the temperature of the kerosene at maximum.

In the flow rate sensor 226, the recess portion 249 is formed in the substrate 241 of the flow rate detector 237 to form an air layer having a high adiabatic effect in the recess portion 249, and the flow rate detector 237 is fixed to the surface of the upper end portion of the fin plate 238 while the surface of the flow rate detector 237 on which the heating element 243 and the temperature sensing element 247 are laminated is confronted to the surface of the upper end portion of the fin plate 238, thereby reducing the contact area between the sealing member 240 and the heating element 243 or the temperature sensing element 247 at maximum, so that the heating value possessed by the temperature sensing element 247 or the heating value transferred through the fin plate 238 can be suppressed from flowing out of or flowing into the sealing member 240 at maximum. Accordingly, the sensitivity of the flow rate sensor 226 is not reduced even when the specific heat of the fluid is small, even when the flow rate is small, etc.

Further, in the flow rate sensor 226, the flow rate detector 237, the upper half portion of the fin plate 238 and the lower half portion of the output terminal 239 are sealed by the sealing member 240 formed by molding, so that it can be surely inserted into the sensor insertion hole 233, 234 of the housing 202, and the heating value transferred to the fin plate 238 can be extremely suppressed from flowing into and out of the housing 202 due to an incomplete sealing state. Also from this viewpoint, the sensitivity of the flow rate sensor 226 is not reduced even when the specific heat of the fluid is small, even when the flow rate is small, etc.

Still further, in the flow rate sensor 226, the flow rate detector 237, the upper half portion of the fin plate 238 and the lower half portion of the output terminal 239 are sealed with the sealing member 240 and unified into one body by molding, and it is sufficient to merely insert the unified body into the sensor insertion hole 233, 234 formed in the housing 202. Therefore, the flow rate sensor 226 can be remarkably simply installed into the housing 202, and also it can be stably fixed and has high durability.

The display portion 228 and the operating portion 229 are disposed on the upper surface of the lid 225 as shown in FIGS. 1 and 2. The display portion 228 comprises a liquid crystal panel, and the measurement value of the flow rate is digitally displayed on the display portion 228. The operating portion 229 comprises a power source button 259 and a measurement button 260. The power is supplied by pushing the power source button 259, and the measurement is carried out by pushing the measurement button 260.

As shown in FIGS. 1 and 3, the flow rate sensor 226 and the temperature sensor 227 are inserted from the sensor setting space 232 of the housing 202 into the sensor insertion holes 233, 234, the lower half portions of the fin plates 238 and 256 are inserted through the opening portions 235 and 236 of the outflow side flow passage 208 and located in the outflow side flow passage 208, and the tip ends of the fin plates 238, 256 are extended to the righthand side with respect to the axial line of the outflow side flow passage 208.

O-rings 261, 262 are interposed between the flow rate sensor 226 or the temperature sensor 227 and the sensor insertion hole 233, 234 to prevent the fluid from leaking through the gap between each sensor and each hole.

After the flow rate sensor 226 and the temperature sensor 227 are inserted, a sensor-pressing plate 263 is inserted into the sensor setting space 232 to press the sealing member of the flow rate sensor 226 and temperature sensor 227. Further, the circuit board 230 is inserted and disposed in the sensor setting space 232, and the lid 225 is mounted on and fixed to the sensor attaching portion 231 to construct the flowmeter section 204.

Figure 8:
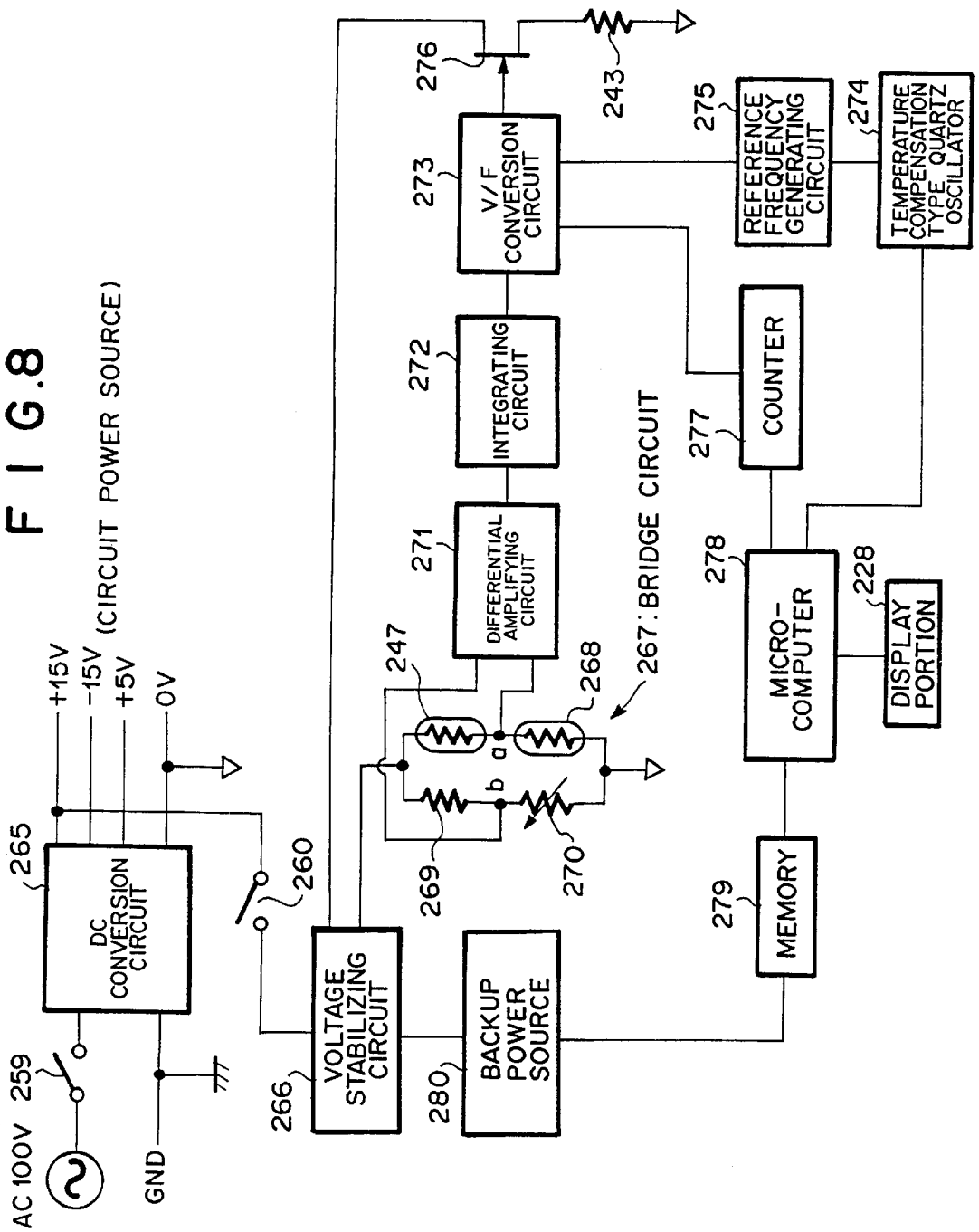
FIG. 8 is an electrical circuit diagram of the embodiment of the strainer integrated flowmeter according to the present invention.

The circuit board 230 is electrically connected to the flow rate sensor 226, the temperature sensor 227, the display portion 228, the operating portion 229 and a power source cord (not shown), and an electrical circuit as shown in FIG. 8 is constructed as a whole.

As shown in FIG. 8, AC 100V serving as the power source is properly converted to DC voltage by a DC conversion circuit 265. The DC voltage thus obtained is stabilized by a voltage stabilizing circuit 266, and the voltage is applied to the heating element 243 of the flow rate sensor 226 and to a bridge circuit 267.

The bridge circuit 267 comprises the temperature sensing element 247 of the flow rate sensor 226, the temperature sensing element 268 of the temperature sensor 227, a resistor 269 and a variable resistor 270. Since the electrical resistance value of the temperature sensing element 247 is varied in accordance with the flow rate of kerosene, the voltage difference Va–Vb at the points a and b of the bridge circuit 267 is also varied. The voltage difference Va–Vb is input through a differential amplifying circuit 271 and an integrating circuit 272 to a V/F conversion circuit 273. In the V/F conversion circuit 273, the pulse signal having the frequency corresponding to the voltage signal input thereto is formed. The frequency of the V/F conversion circuit 273 is formed on the basis of the reference frequency which is set on the basis of the high-precision clock formed in a reference frequency generating circuit 275 on the basis of the oscillation of a temperature compensation type quartz oscillator 274.

When the pulse signal output from the V/F conversion circuit 273 is input to the transistor 276, current flows through the heating element 243 and the heating element 243 heats. The pulse signal is also counted by a counter 277, and it is converted to the flow rate corresponding to the frequency thereof in the microcomputer 278. The flow rate value thus converted is digitally displayed on the display portion 228, and also stored in a memory 279.

Reference numeral 280 represents a backup power source such as a battery or the like.

According to the strainer integrated flowmeter 201 of the present invention in which the strainer and flowmeter are integrated to share the housing, the number of parts can be reduced and the costs for manufacturing the parts and assembling the apparatus with use of the parts can be also reduced.

Hereinafter, the method of using the strainer integrated flowmeter 201 of the present invention and the function and effect thereof will be described.

Figure 27:
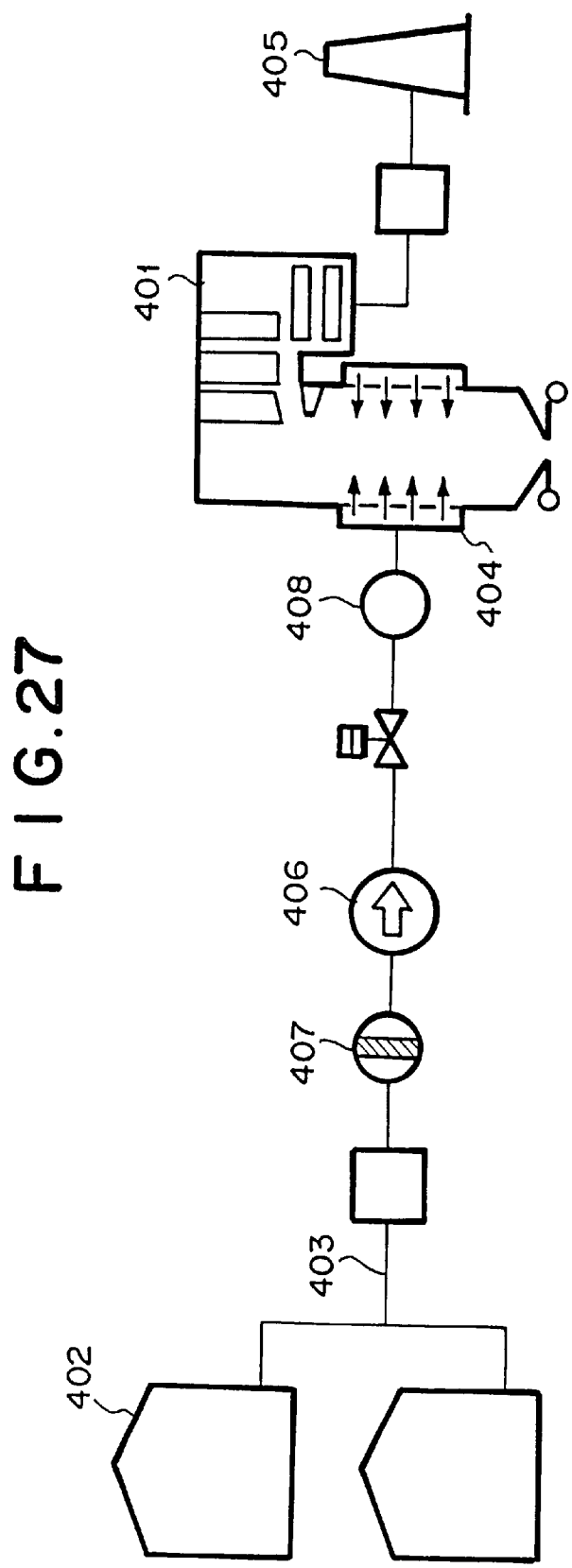
FIG. 27 is a schematic diagram showing a process of supplying kerosene from a tank, burning kerosene by a burner and discharging combusted gas from a chimney.
Figure 28A:
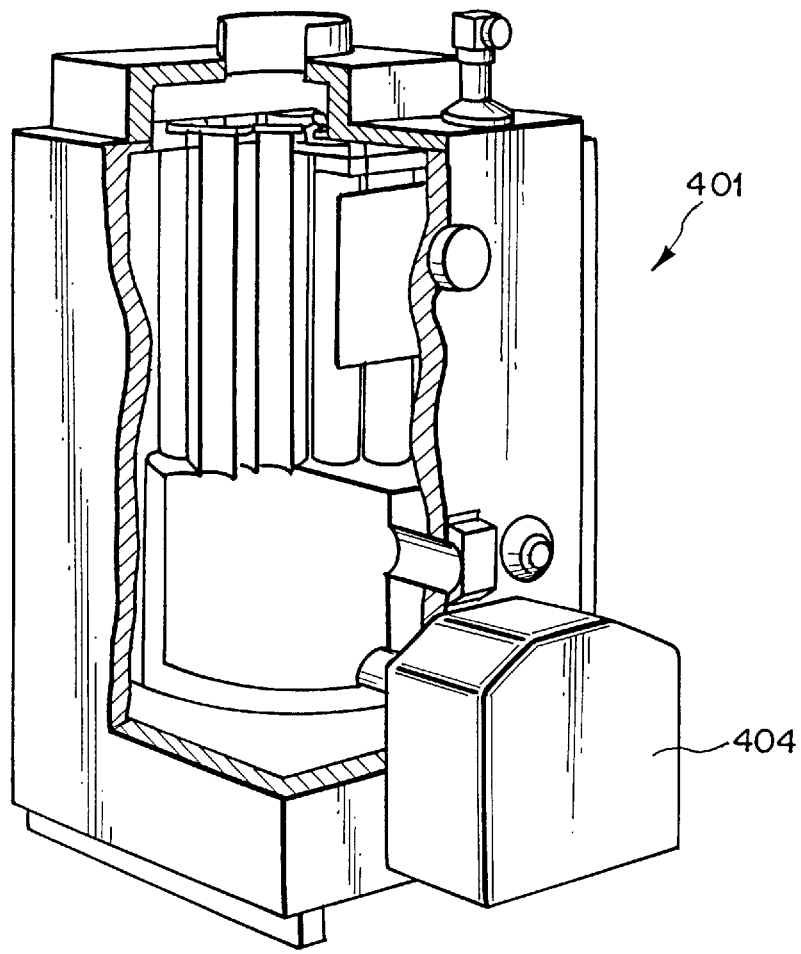
FIG. 28A is a partially cut-out, perspective view of a boiler.
Figure 28B:
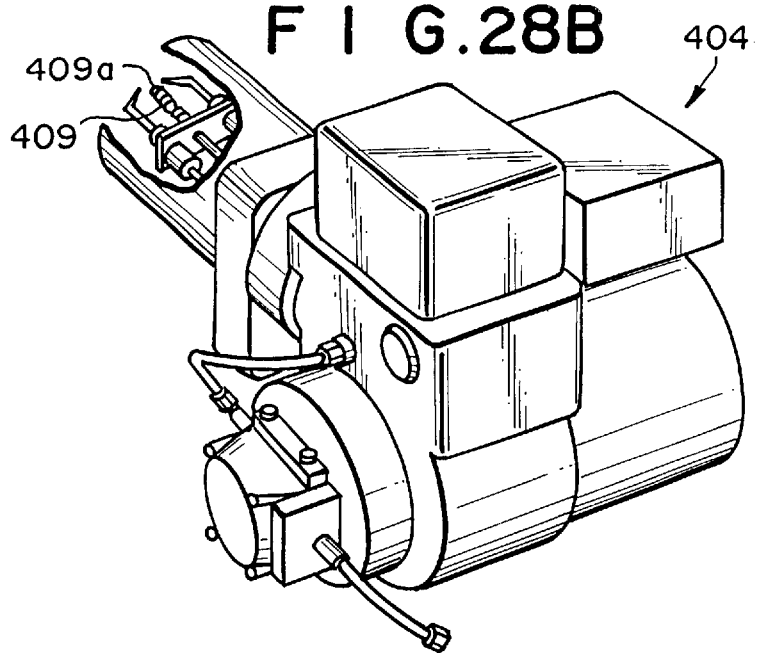
FIG. 28B is a partially cut-out, perspective view of the burner.

The strainer integrated flowmeter 201 is disposed at a position (i.e. the position between the tank 402 and the pump 406, where the strainer 407 is disposed, in FIG. 27) between a tank and a pump in the pipe line for supplying the kerosene to the apparatus where the kerosene is burnt. The strainer 407 removes the foreign matters such as dusts, etc. contained in kerosene by adsorbing it with use of the filter. When the adsorption capacity of the filter is lowered, it is necesary to perform washing treatment of the filter or exchange the filter to fresh one. Therefore the strainer 407 is detachably attached to the pipe line, and thus the strainer integrated flowmeter 201 of the present invention can be easily attached to the pipe line at the same position as the strainer 407 shown in FIG. 27 by coupling the connection portions 205, 206 to the pipe line in substantially the same manner as the case of the strainer 407.

Since the strainer integrated flowmeter 201 of the present invention can be easily attached to the pipe line at the same position as the conventional strainer 407 to the pipe line in substantially the same manner as the case of the strainer 407, some pipe line portions can be eliminated to realize shorter length of the pipe line as compared with the conventional case where the strainer 407 and the flowmeter 408 are arranged individually.

After the strainer integrated flowmeter 201 is attached to the pipe line for supplying the kerosene to the kerosene burning apparatus, the power source button 259 is pushed to supply the electric power and the measurement button 260 is pushed so that the electric circuit shown in FIG. 8 is closed to operate.

The electrical resistance value of the temperature sensing element 247 is varied in accordance with the flow rate of kerosene, the voltage difference Va–Vb is obtained at the points a and b of the bridge circuit 267, the pulse signal formed in the V/F conversion circuit 273 is counted by the counter 277, then the signal is converted to the flow rate by the microcomputer 278, and the flow rate value is digitally displayed on the display portion 228.

In the strainer integrated flowmeter 201, the flowmeter section 204 is disposed immediately downstream the strainer section 203 where the foreign matters such as dusts, etc. are removed from the kerosene, so that the minute foreign matters are hardly accummulated in the shorter passage between the strainer section 203 and the flowmeter section 204, and the additional foreign matters hardly invade such a shorter passage. Therefore, it can be avoided that the foreign matters such as dusts, etc. are fixed and accumulated on the O-ring in the sensor attaching portion to cause the gap through which the kerosene leaks, and the foreign matters are fixed and accumulated on the fin plate of the sensor to reduce the heat transferring area thereof or change the manner of kerosene flow to thereby lower the flow rate detection accuracy.

In the strainer integrated flowmeter 201, the vent hole 215 is communicated to the flow passage so that the eventually remaining air in the flow passage can be removed through the vent hole 215 when setting the strainer integrated flowmeter 201, whereby no air bubble remains at the upper side of the inside of the flow passage. Therefore, it can be avoided that air bubbles are fixed onto the fin plate of the sensor to change the heat transferring manner through the fin plate to thereby lower the flow rate detection accuracy.

In the strainer integrated flowmeter 201, the flow rate value is digitally displayed on the display portion 228. Therefore, the operator immediately recognize the flow rate value, and if the flow rate value is lower than the predetermined value, then the operator decides that the nozzle of the burner is partially sealed on the basis of invasion of the foreign matters into the nozzle, and then performs the operation of removing the foreign matters from the nozzle.

The kerosene introduced into the filter member insertion cylinder 210 through the inflow side flow passage 207 flows through the filter 218 and communication holes 222 of the filter member 209, and goes upward to be introduced into the vertical portion 208a of the outflow side flow passage 208. During such a process, the turbulent flow of kerosene is regulated to realize the laminar flow in the vertical portion 208a of the outflow side flow passage 208. Therefore, the kerosene flows through the vicinity of the fin plate 238 of the flow rate sensor 226 with substantial uniformity to thereby enhance the accuracy of the flow rate detection.

When the fluid passes through the bent portion of the pipe line, the fluid flow is often separated from the inner surface of the pipe line to generate the eddy. However, in the strainer integrated flowmeter 201, since the flow rate sensor 226 is positioned in the vertical portion 208a of the outflow side flow passage 208, the flow rate detection is performed on the fluid before the fluid is separated from the inner surface of the flow passage to generate the eddy, to thereby enhance the accuracy of the flow rate detection.

Figure 9:
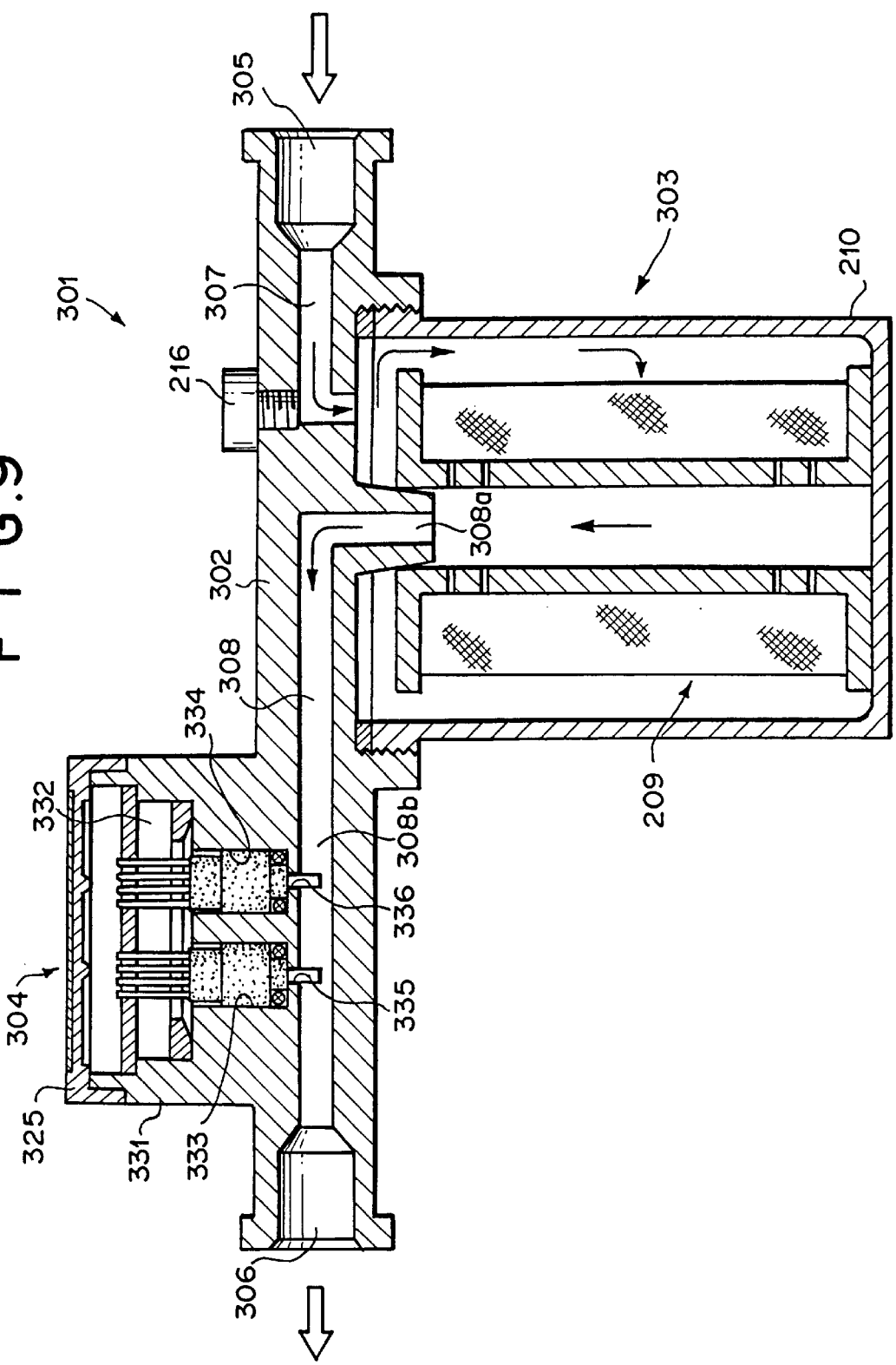
FIG. 9 is a longitudinal, cross-sectional view showing another embodiment of the strainer integrated flowmeter according to the present invention.
Figure 10:
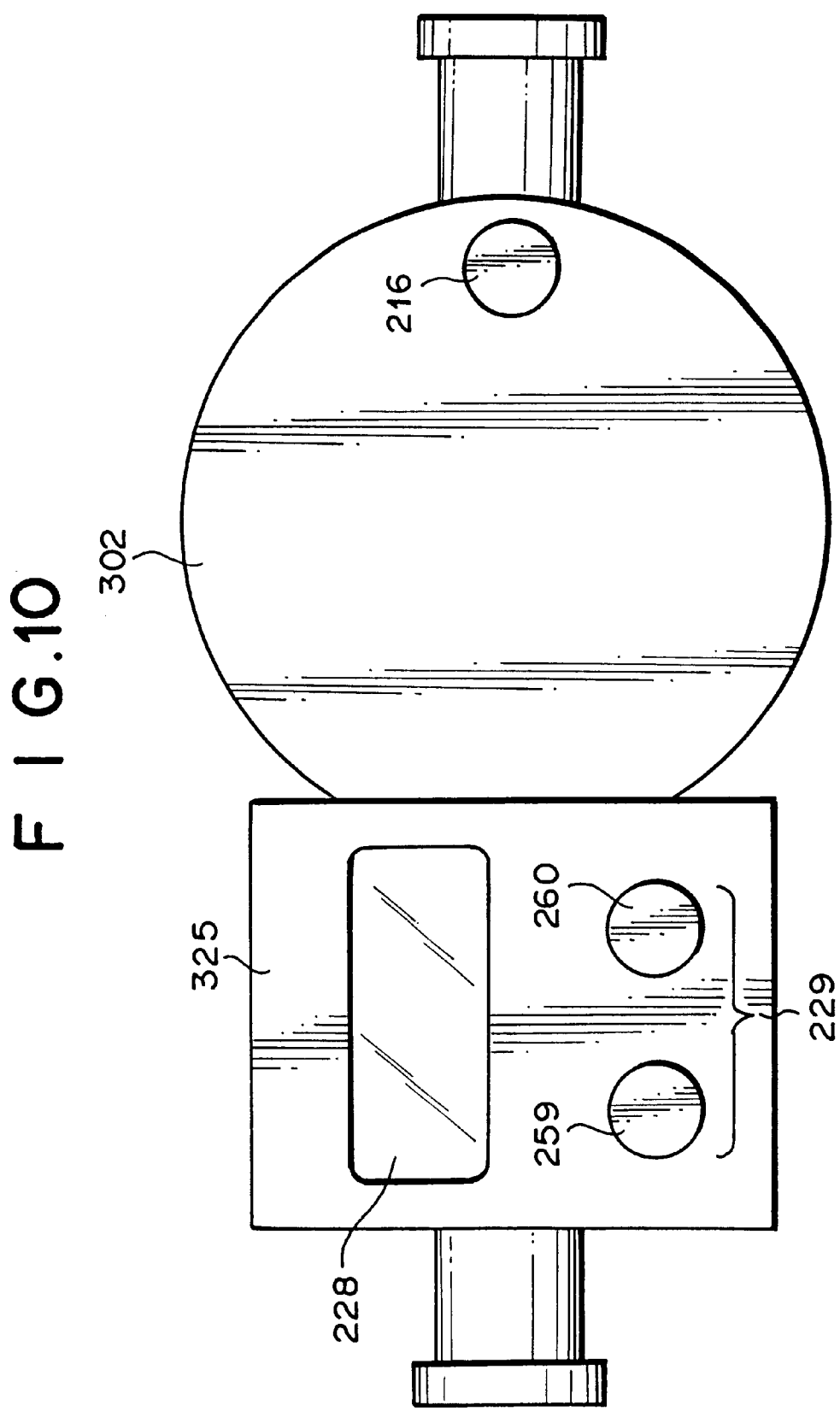
FIG. 10 is a plan view showing the embodiment of the strainer integrated flowmeter according to the present invention.
Figure 11:
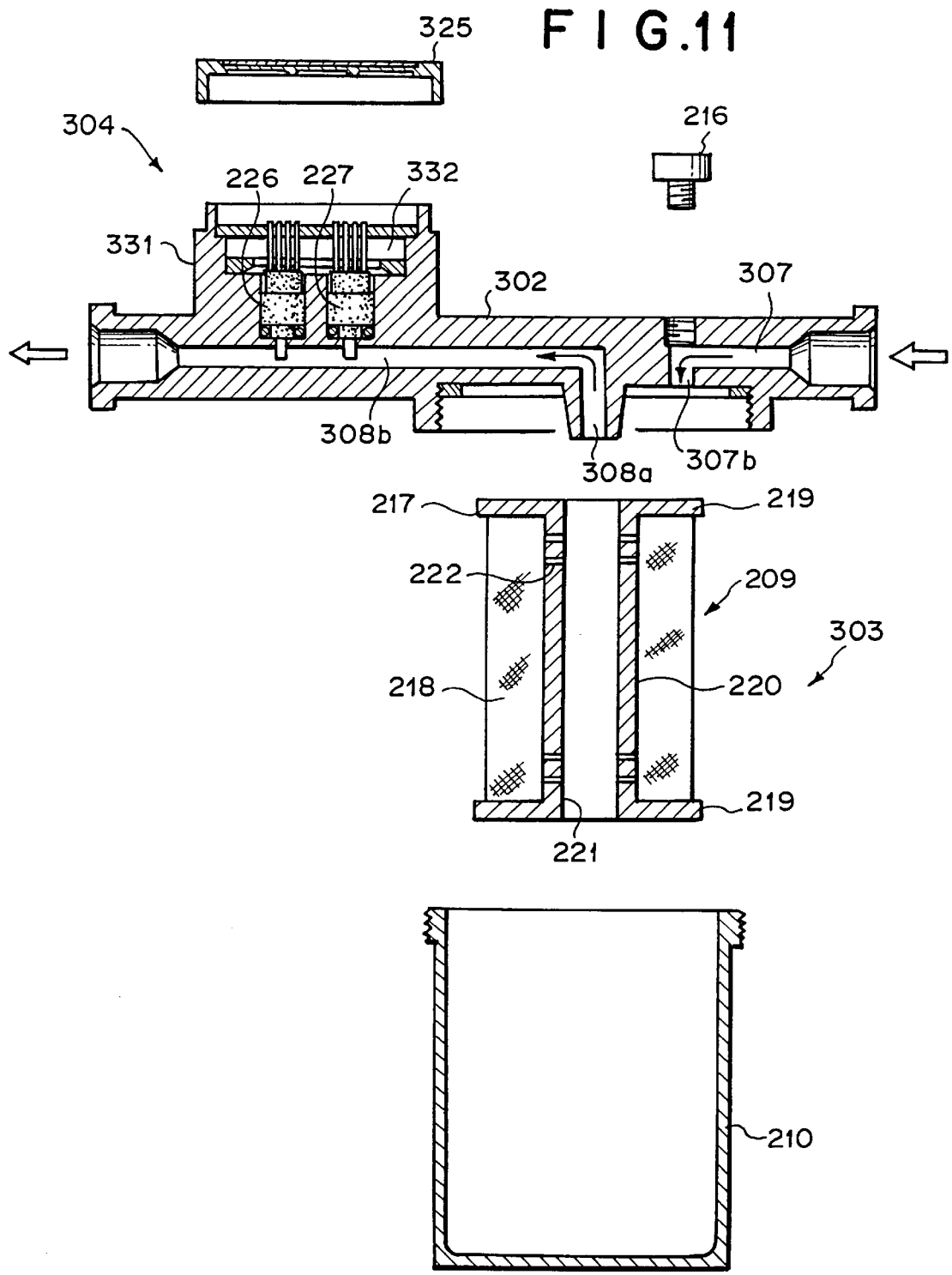
FIG. 11 is an exploded, longitudinal, cross-sectional view showing the embodiment of the strainer integrated flowmeter according to the present invention.

FIGS. 9 to 11 show another embodiment of the strainer integrated flowmeter according to the present invention.

Also in a strainer integrated flowmeter 301, a strainer section 303 and a flowmeter section 304 are integrated to each other so as to share a housing 302 with each other. However, the strainer integrated flowmeter 301 differs from the embodiment of FIGS. 1 to 8 in that the flowmeter section 304 is formed with the lefthand half portion of the housing 302.

On the lefthand half portion of the housing 302, there is formed a sensor attaching portion 331 at the upper side thereof. A sensor setting space 332 is formed at the upper side of the sensor attaching portion 331, and sensor insertion holes 333, 334 are formed so as to communicate both the sensor setting space 332 and the horizontal portion 308b of the outflow side flow passage 308. Openings 335, 336 are formed at the positions corresponding to the sensor insertion holes 333, 334 of the horizontal portion 308b of the outflow side flow passage 308, respectively. The lid 325 is detachably attached to the upper portion of the sensor attaching portion 331.

The other portions of the strainer integrated flowmeter 301 is the same as those of the strainer integrated flowmeter 201. In FIGS. 9 to 11, the portions corresponding to those in FIGS. 1 to 8 are designated with the same reference numerals. The effect of the strainer integrated flowmeter 301 is substantially the same as those of the strainer integrated flowmeter 201. However, in the strainer integrated flowmeter 301, the kerosene flow is separated from the inner surface of the flow passage to generate the eddy in the bent portion between the vertical portion 308a and the horizontal portion 308b, while the kerosene flow is laminar flow when the kerosene is introduced into the vertical portion 308a of the outflow side flow passage 308. In the strainer integrated flowmeter 301, since the flow rate sensor 226 is positioned in the horizontal portion 308b of the outflow side flow passage 308, the flow rate detection is performed on the kerosene after the fluid is separated from the inner surface of the flow passage to generate the eddy. Therefore, the accuracy of the flow rate detection in the strainer integrated flowmeter 301 is sometimes slightly lower than that of the strainer integrated flowmeter 201.

Figure 12:
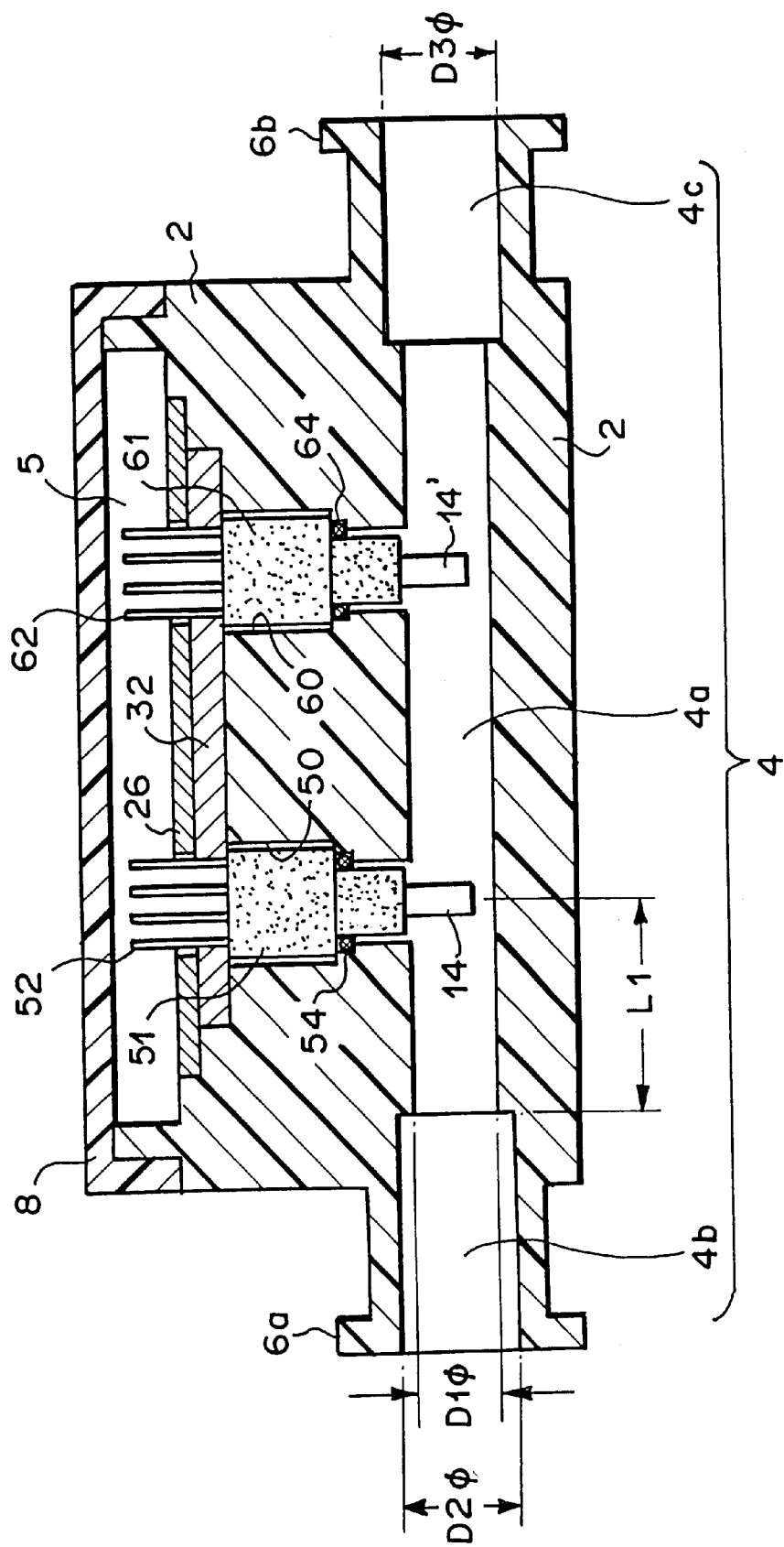
FIG. 12 is a cross-sectional view taken along a fluid-flowing pipe line showing an embodiment of a flow rate sensor according to the present invention.

FIGS. 12 and 13 are cross-sectional views showing an embodiment of a flow rate sensor (flowmeter) according to the present invention, and particularly, FIG. 12 is a cross-sectional view taken along a pipe line (flow passage) through which the fluid flows, and FIG. 13 is a cross-sectional view taken perpendicularly to the pipe line.

In these figures, 2 represents the main body portion of a casing, and a pipe line 4 serving as a flow passage for fluid to be detected is formed so as to penetrate through the casing main body portion. The pipe line 4 extends between both the ends of the casing main body portion 2. The pipe line 4 comprises a central portion 4a and an inflow-side portion 4b and outflow-side portion which are positioned in both sides of the central portion 4a along the fluid flowing direction. Connection portions 6a, 6b (e.g. quick coupling structure, not shown in detail) for connecting to an external pipe line are formed at both ends of the casing main body portion. The casing main body portion 2 is made of a synthetic resin, for example vinyl chloride resin, or glass fiber reinforced polyphenylene sulfide (PPS) or polybutylene terephthalate (PBT) having good chemical-resistance and oil-resistance, etc. A device accommodating portion 5 is formed at the upper side of the pipe line 4 in the main body portion 2 of the casing, and a casing lid portion 8 is fixed to the accommodating portion 5 by a screw or tight fitting. The casing is constructed by the casing lid portion 8 and the casing main body portion 2.

In this embodiment, two device unit retaining portions 50, 60 are formed at the bottom (i.e. side near the pipe line 4) of the device accommodating portion 5 of the casing main body portion 2 so as to be adjacent to the pipe line 4. The unit retaining portions 50, 60 each has a stepped cylindrical inner surface having a symmetrical axis extending in radial direction of the pipe line 4. A flow rate detecting unit 51 is retained by the first retaining portion 50, and a temperature detecting unit 61 is retained by the second retaining portion 60.

FIG. 14 is a cross-sectional view showing the flow rate detecting unit 51. As shown in FIG. 14, the flow rate detecting unit 51 has a flow rate detector 12, a fin plate 14 serving as a heat transfer member joined to the flow rate detector 12 via an adhesive member 16 having good thermal conduction property, electrode terminals 52, bonding wires 28 electrically connecting electrodes of the flow rate detector 12 to the corresponding electrode terminals 52, and a base portion 53 made of synthetic resin. The base portion 53 has low thermal conductivity (i.e. having heat insulation property) and good chemical-resistance and oil-resistance, etc., and is made of PPS or PBT, etc. The base portion 53 has a stepped cylindrical outer surface corresponding to the inner surface of the retaining portion 50. A part of the fin plate 14 extends from the base portion 53 into the pipe line 4, while a part of the electrode terminal 52 extends from the base portion 53 toward the opposite side (outside). That is, the flow rate detector 12, the adhesive member 16, a part of the fin plate 14, a part of the electrode terminal 52 and the bonding wires 28 are sealed with the base portion 53.

As shown in FIG. 15, the flow rate detector 12 is designed in a chip structure by forming an insulating layer 12-2 on the upper surface (first surface) of a substrate 12-1, forming a thin-film heating element 12-3 on the insulating layer 12-2, forming on the-heating element a pair of electrode layers 12-4, 12-5 for the thin-film heating element, forming an insulating layer 12-6 thereon, forming a flow rate detection thin-film temperature sensing element 12-7 on the insulating layer 12-6 and then forming an insulating layer 12-8 on the flow rate detection thin-film temperature sensing element 12-7. As the substrate 12-1 may be used a member which is set to about 0.5 mm in thickness and about 2 to 3 mm in square and also formed of silicon or alumina (when an insulating substrate of alumina or the like is used, the insulating layer 12-2 may be omitted), and as the thin-film heating element 12-3 may be used a member of cermet which is set to about 1 $\mu$m in thickness and designed in a desired shape by patterning. As the electrode layers 12-4, 12-5 may be used a member which is formed of nickel at a thickness of about 0.5 $\mu$m or a member obtained by laminating gold layer on the above member at a thickness of about 0.1 $\mu$m. The insulating layers 12-2, 12-6, 12-8 may be formed of $SiO_2$ at a thickness of about 1 $\mu$m. As the thin-film temperature sensing element 12-7 may be used a metal resistant film having a large and stable temperature coefficient such as platinum or nickel which is patterned into a desired shape, for example, a meandering shape at a thickness of about 0.5 to 1 $\mu$m (or may be used a member formed of NTC thermistor of manganese oxide). The thin-film heating element 12-3 and the thin-film temperature sensing element 12-7 are disposed so as to be extremely proximate to each other through the thin-film insulating layer 12-6 as described above, whereby the thin-film temperature sensing element 12-7 is immediately affected by the effect of heating of the thin-film heating element 12-3.

As shown in FIG. 14, the fin plate 14 serving as a heat transfer member is joined to one surface of the flow rate detector 12, that is, the second surface of the substrate 12-1 by the joint member 16 having excellent thermal conductivity. The fin plate 14 may be made of copper, duralumin, copper-tungsten alloy or the like. Silver paste may be used as the joint member 16.

As shown in FIGS. 12 and 13, an O-ring 54 as a sealing member for the pipe line 4 is disposed between the outer peripheral surface of the base portion 53 of the flow rate detecting unit 51 and the inner surface of the unit retaining portion 50.

The upper portion of the fin plate 14 is connected to the flow rate detector 12 while the lower portion thereof extends into the central portion 4a of the pipe line 4. The fin plate 14 extends into the central portion 4a of the pipe line 4 having a substantially circular shape in cross section so as to pass through the center on the section of the central portion 4a of the pipe line 4 and traverse from the upper portion to the lower portion of the central portion 4a of the pipe line 4. However, the pipe line 4 is not necessarily circular in cross section, but may have a proper sectional shape. In the pipe line 4, the width (size taken along the direction of the pipe line) of the fin plate 14 is sufficiently larger than the thickness of the fin plate 14. Therefore, the fin plate 14 can excellently transfer heat between the flow rate detector 12 and the fluid without greatly affecting the flow of the fluid in the central portion 4a of the pipe line 4.

In the casing main body portion 2, the unit retaining portion 60 is disposed at a position which is separated from the unit retaining portion 50 along the pipe line 4. The temperature detector 61 is retained by the unit retaining portion 60.

The temperature detecting unit 61 differs from the flow rate detecting unit 51 substantially only in that a temperature detector is used instead of the flow rate detector 12. The temperature detecting unit 61 has a fin plate 14' serving as a heat transfer member joined to the temperature detector via an adhesive member having good thermal conduction property, electrode terminals 62, bonding wires electrically connecting electrodes of the temperature detector to the corresponding electrode terminals 62, and a base portion made of synthetic resin. A part of the fin plate 14' extends from the base portion into the pipe line 4, while a part of the electrode terminal 62 extends from the base portion toward the opposite side (outside).

The temperature detector is designed in such a chip structure that a thin-film temperature sensing element for the compensation of the fluid temperature similar to that of the flow rate detector 12 is formed on a substrate similar to that of the flow rate detector 12. That is, the temperature detector has the same construction as shown in FIG. 15 with the exception that the thin-film heating element 12-3, a pair of electrode layers 12-4, 12-5 and the insulating layer 12-6 are omitted. The temperature detector is connected to the fin plate 14' via a joining member in the same manner as the case of the flow rate detector 12.

As shown in FIG. 12, an O-ring 64 as a sealing member for the pipe line 4 is disposed between the outer peripheral surface of the temperatutre detecting unit 61 and the inner surface of the unit retaining portion 60.

The temperature detecting unit 61 is preferably positioned at the downstream side of the flow rate detecting unit 51 relative to the flowing direction of the fluid in the central portion 4a of the pipe line 4.

In the accommodating portion 5 of the casing body portion 2, a pressing plate 32 for the flow rate detecting unit 51 and the temperature detecting unit 61, and a wiring board 26 is fixedly disposed thereon. Some electrodes of the wiring board 26 are electrically connected to the electrodes 52 of the flow rate detecting unit 51 by wire bonding etc. (not shown), and also to the electrodes 62 of the temperature detecting unit 61 by wire bonding etc. (not shown). Some other electrodes of the wiring board 26 are connected to external lead wires 30, and the external lead wires 30 extend to the outside of the casing. The external lead wires 30 may be integrally formed on a predetermined position of the casing main body portion 2 in advance, so that the external lead wires 30 are electrically connected to the electrodes of the wiring board 26 when the wiring board 26 is attached to the main body portion 2.

Figure 16:
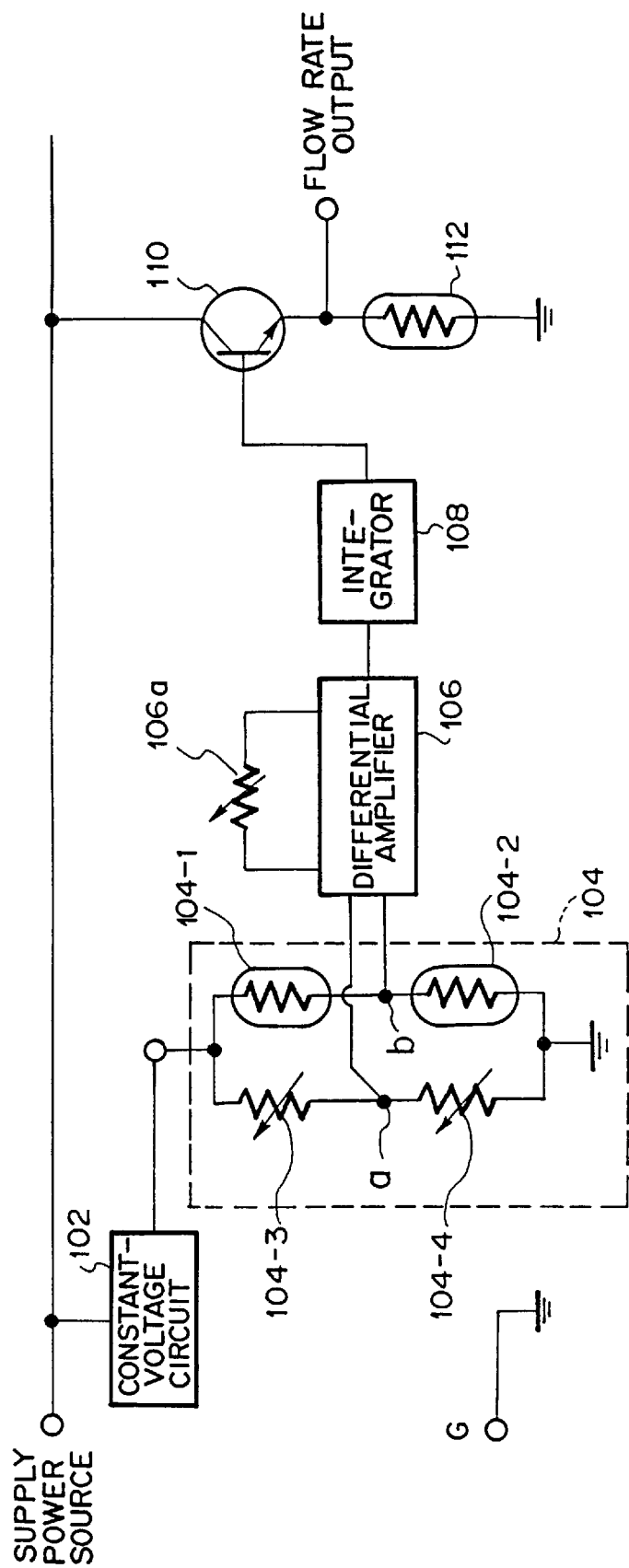
FIG. 16 is an electrical circuit diagram of the embodiment of the flow rate sensor according to the present invention.

FIG. 16 is a diagram showing the circuit construction of a flow rate sensor according to the present invention. A supply power source is set to +15V(±10%), for example, and it is supplied to a constant-voltage circuit 102. The constant-voltage circuit 102 has an output of 0.1 W at +6V (±3%), and the output thereof is supplied to the bridge circuit 104. The bridge circuit 104 contains a flow rate detection temperature sensing element 104-1 (the above 12-7), a temperature compensation temperature sensing element 104-2 and variable resistors 104-3, 104-4.

The voltages at points a and b are applied to a differential amplifying circuit 106. The amplification factor of the differential amplifying circuit 106 is made variable by a variable resistor 106a. The output of the differential amplifying circuit 106 is input to an integrating circuit 108. The differential amplifying circuit 106 whose amplification factor is variable and the integrating circuit 108 function as responsibility setting means as described later.

The supply power source is connected to the collector of an NPN transistor 110, and the emitter of the transistor 110 is connected to a heating element 112 (the above 12-3). The output of the integrating circuit 108 is input to the base of the transistor 110. That is, the supply power source supplies current through the transistor 110 to the heating element 112, and the voltage to be applied to the heating element 112 is controlled by a divided voltage applied to the transistor 110. The divided voltage of the transistor 110 is controlled by the output current of the integrating circuit 108 input to the base through the resistor, and the transistor 110 functions as a variable resistor and as control means for controlling the heating of the heating element 112.

In the flow rate detector 12, the temperature sensing of the thin-film temperature sensing element 12-7 is carried out-in the flow rate detector 12 while being affected by the heat absorption of the fluid to be detected through the fin plate 14 due to the heating of the thin-film heating element 12-3. As a result of the temperature sensing, the difference between the voltages (potentials) Va, Vb at the points a, b of the bridge circuit 104 shown in FIG. 16 is obtained.

The temperature of the flow rate detection temperature sensing element 104-1 is varied in accordance with the flow rate of the fluid, resulting in variation of the value of (Va−Vb). By setting the resistance values of the variable resistors 104-3, 104-4 to proper values in advance, the value of (Va−Vb) can be set to zero when the flow rate of the fluid is equal to a desired value serving as a reference. At this reference flow rate, the output of the differential amplifying circuit 106 is equal to zero, and the output of the integrating circuit 108 is fixed, so that the resistance value of the transistor 110 is also fixed. In this case, the divided voltage to be applied to the heating element is also fixed, and the flow rate output at this time indicates the above reference flow rate.

If the flow rate of the fluid is increased or reduced from the reference flow rate, the output of the differential amplifying circuit 106 is varied in polarity (which is determined in accordance with the positive/negative sign of the resistance-temperature characteristic of the flow rate detection temperature sensing element 104-1) and magnitude in accordance with the value of (Va−Vb), resulting in variation of the output of the integrating circuit 108. The variation speed of the output of the integrating circuit 108 can be adjusted by setting the amplification factor of the differential amplifying circuit 106 with the variable resistor 106a. The response characteristic of the control system can be set by the integrating circuit 108 and the differential amplifying circuit 106.

When the flow rate of the fluid increases, the temperature of the flow rate detection temperature sensing element 104-1 is reduced, and thus the integrating circuit 108 supplies the base of the transistor 110 with such a control input as to reduce the resistance of the transistor 110 so that the heating value of the heating element 112 is increased (that is, the current to be supplied to the heating element 112 is increased).

On the other hand, when the flow rate of the fluid is reduced, the temperature of the flow rate detection temperature sensing element 104-1 is increased. Therefore, the integrating circuit 108 supplies the base of the transistor 110 with such a control input as to increase the resistance of the transistor 110 so that the heating value of the heating element 112 is reduced (that is, the current to be supplied to the heating element 112 is reduced).

As described above, the heat of the heating element 112 is subjected to feed-back control so that the temperature detected by the flow rate detection temperature sensing element 104-1 is equal to a target value irrespective of the variation of the flow rate of the fluid at all times (if occasion demands, the polarity of the output of the differential amplifying circuit 106 is properly inverted in accordance with the positive/negative sign of the resistance-temperature characteristic of the flow rate detection temperature sensing element 104-1). At this time, the voltage to be applied to the heating element 112 is matched with the flow rate of the fluid and thus it is picked up as the output of the flow rate.

According to the above embodiment, the temperature of the flow rate detection temperature sensing element 104-1 around the heating element 112 can be kept to a substantially fixed value irrespective of the flow rate of the fluid to be detected, so that the flow rate sensor is not degraded with time lapse and also occurrence of ignition and explosion of the inflammable fluid to be detected can be prevented. Further, in this embodiment, no constant-voltage circuit is required for the heating element 112, and thus there is an advantage that it is sufficient to use a low-output constant-voltage circuit 102 for the bridge circuit 104. Therefore, the heating value of the constant-voltage circuit can be reduced, and the flow rate detection accuracy can be kept excellent even if the flow rate sensor is miniaturized.

In this embodiment, as shown in FIG. 12, the inner diameters of the central portion 4a, inflow side portion 4b and outflow side portion 4c of the pipe line 4 are D1φ, D2φ and D3φ, respectively, wherein D1φ is smaller than each of D2φ and D3φ. Therefore, the fluid flow especially at the outer portion in the cross section of the pipe line 4 is disturbed by the step formed between the inflow side portion 4b and the central portion 4a when the fluid flows from the inflow side portion 4b to the central portion 4a, so that the area of enhanced fluidity reaches the outer peripheral portion in cross section of the central portion 4a, and the fluid becomes in contact with a larger area of the fin plate 14 at a uniform velocity. Accordingly, the heat dissipation through the fin plate 14 is performed so as to correspond more accurately to the flow rate of the fluid in the pipe line 4.

The relationship "D2φ=D3φ" is preferably selected in the viewpoint that the flow rates of the fluid at the upstream and downstream sides of the flow rate sensor can be made equal.

The inner diameter D1φ of the central portion is preferably set to 50 to 80% of the inner diameter D2φ of the inflow side portion. The reason is as follows: As the ratio (D1φ/D2φ) becomes lower under 50%, the pressure loss of the fluid flow tends to become significantly greater to suppress the fluid flow. On the other hand, as the ratio (D1φ/D2φ) becomes greater over 80%, the functions to enhance the uniformity of the flow rate distribution in the cross section of the pipe line due to the fluid disturbance tends to become lower.

As shown in FIG. 12, the fin plate 14 is disposed at the position separated from the end portion of the central portion 4a at the interface with the inflow side portion 4b by the interval L1 in the direction of the pipe line 4. The interval L1 is preferably set to 4 times of the inner diameter D1φ of the central portion 4a or less, more preferably to twice or less. The reason is as follows: As the interval L1 becomes excessively greater, the disturbance state of the fluid tends to be attenuated before the fluid disturbed by the step between the central portion 4a and the inflow side portion 4b reaches the fin plate.

Figure 17:
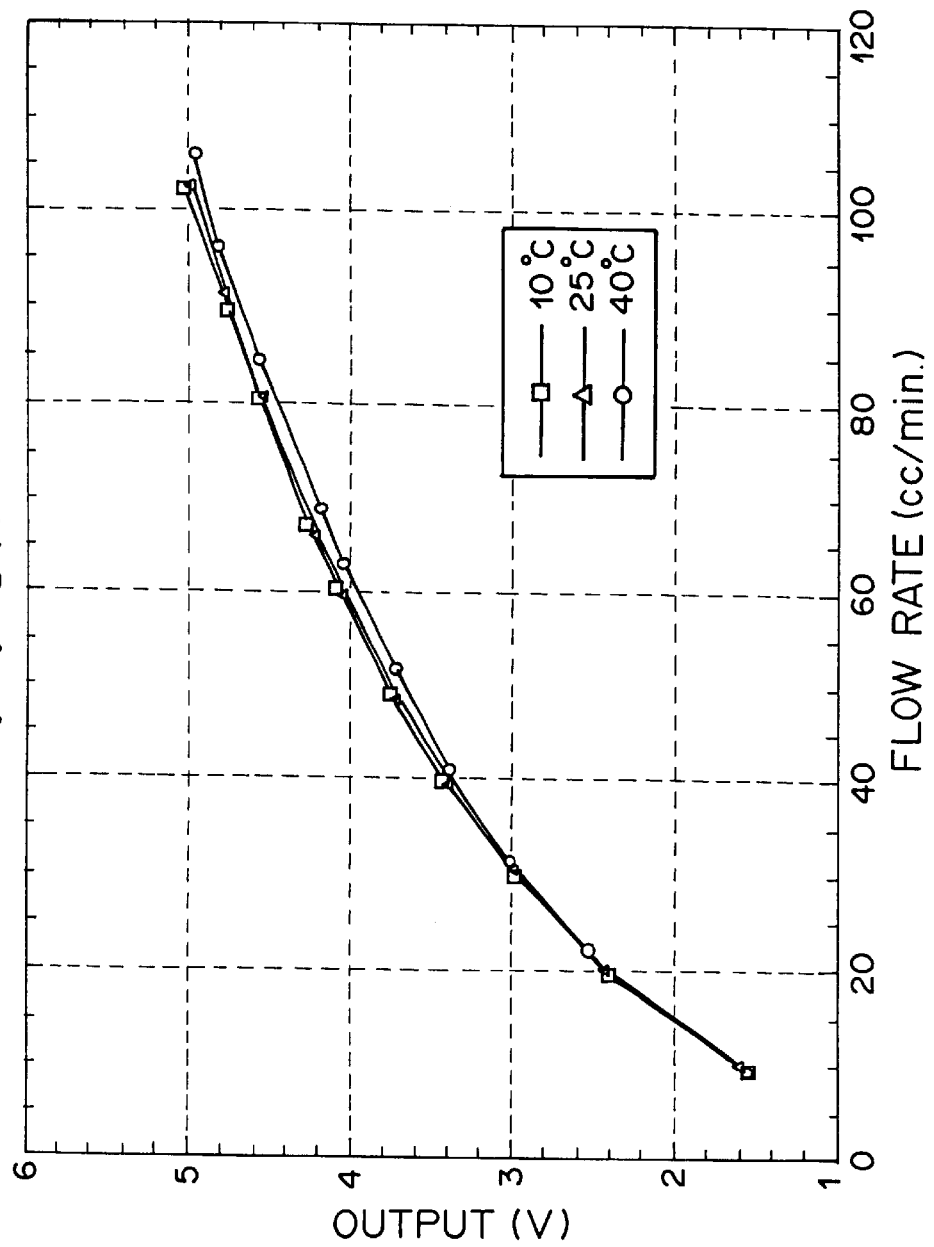
FIG. 17 is a graph showing detection results of relationship between variation of flow rate output voltage and variation of flow rate at different fluid temperatures obtained in the embodiment of the flow rate sensor according to the present invention.
Figure 18:
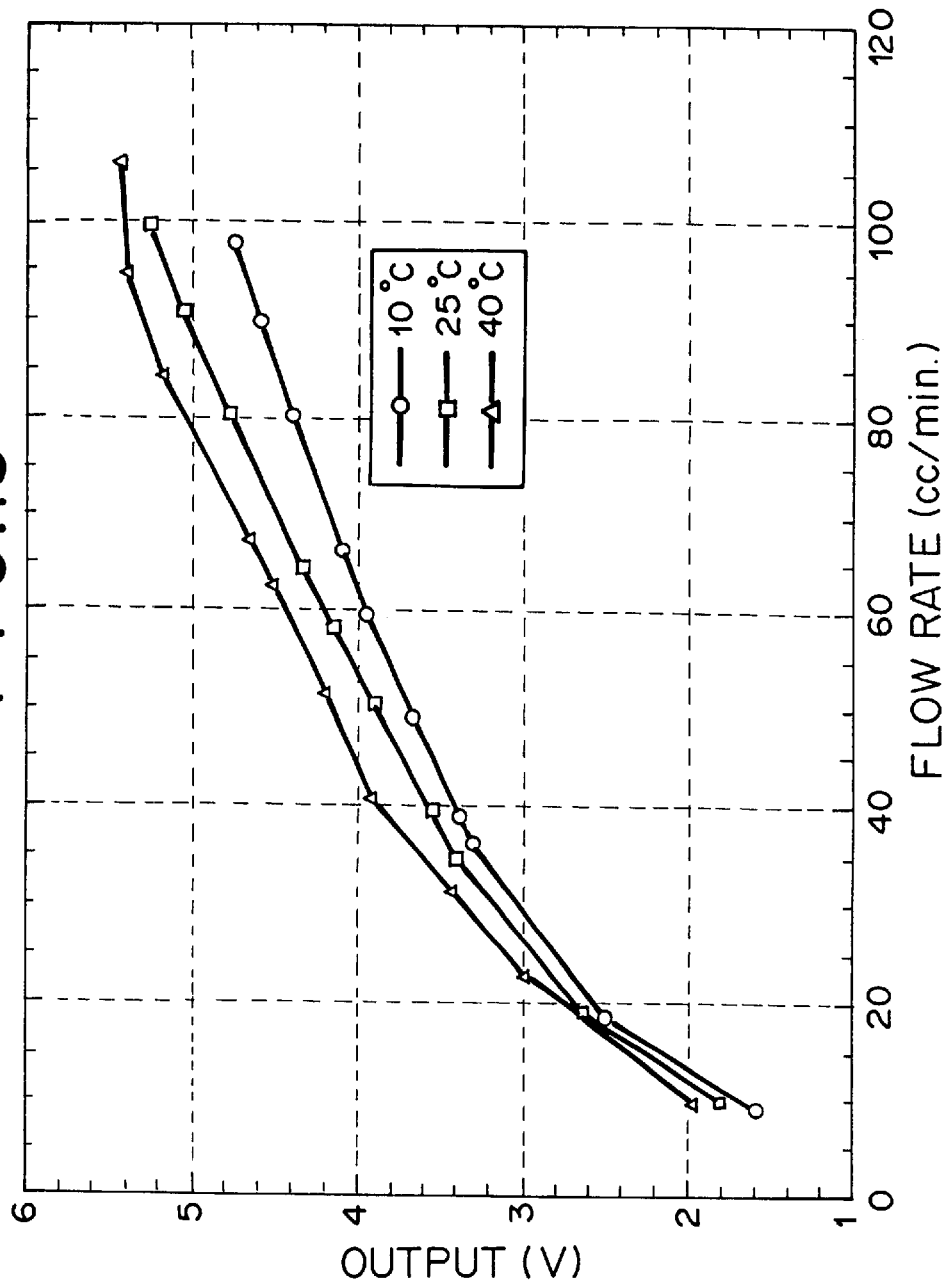
FIG. 18 is a graph showing detection results of relationship between variation of flow rate output voltage and variation of flow rate at different fluid temperatures obtained in comparative flow rate sensor.

FIG. 17 is a graph showing detection results of relationship between variation of flow rate output voltage and variation of flow rate at different fluid temperatures obtained in the above embodiment of the flow rate sensor. Kerosene was used as the fluid, D1φ was set to 4 mm and both of D2φ and D3φ were set to 6 mm. As apparent from FIG. 17, there is substantially no variation of the flow rate output voltage due to the variation of the fluid temperature. On the other hand, FIG. 18 is a graph showing detection results of the same relationship as the case of FIG. 17 except that D1φ was set to 6 mm, i.e. all of D1φ, D2φ and D3φ were set to 6 mm. As apparent from FIG. 18, there is variation of the flow rate output voltage due to the variation of the fluid temperature.

Figure 19:
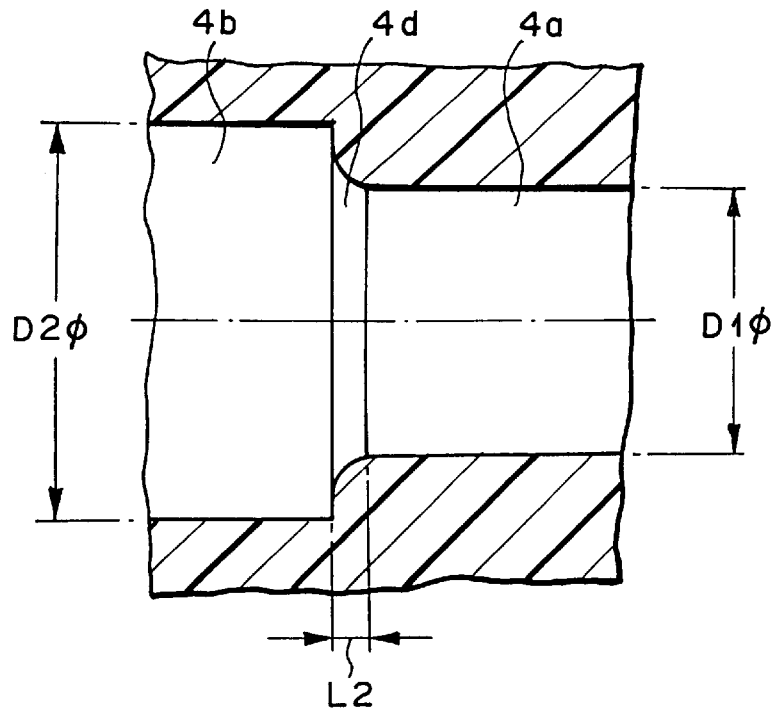
FIG. 19 is a partial, cross-sectional view showing a modification of the embodiment of the flow rate sensor according to the present invention.
Figure 20:
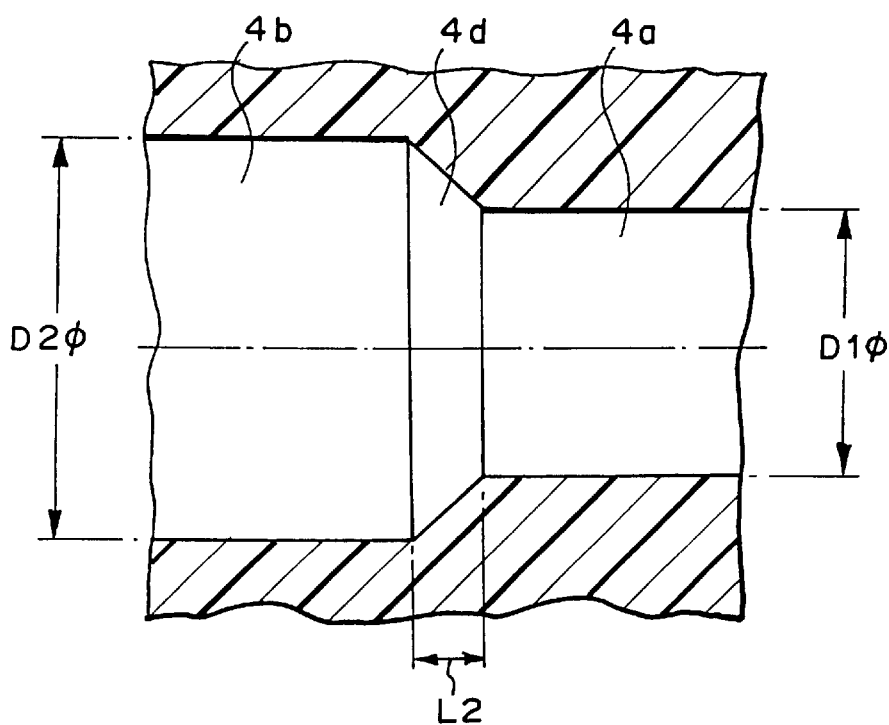
FIG. 20 is a partial, cross-sectional view showing another modification of the embodiment of the flow rate sensor according to the present invention.

In the above embodiment, there is formed a steep step at the interface between the central portion 4a and inflow side portion 4b of the pipe line 4. However, the interface is not restricted to such a steep step, but it may be an intermediate portion having continuously varying inner diameter of the pipe line 4 between the central portion 4a and inflow side portion 4b. FIGS. 19 and 20 are a partial, cross-sectional view showing modifications having such an intermediate portion. In the modification of FIG. 19, the intermediate portion 4d has a bevelled surface of round shape in cross section having the length of L2 in the pipe line direction. The bevelled surface may be of ordinary straight line shape in cross section making angle of 45 degree relative to the pipe line direction. In the modification of FIG. 20, the intermediate portion 4d has a tapered surface of straight shape in cross section from the inflow side portion side to the central portion side. The length L2 of the intermediate portion 4d is preferably less than a half of the difference between the inner diameter D2φ of the inflow side portion 4b and the inner diameter D1φ of the central portion 4a. The reason is as follows: As the length L2 becomes excessively greater, the functions of the fluid disturbance caused by the stepped shape of the intermediate portion 4d tends to become lower.

In the above embodiment, the fin plates 14, 14' extend so as to pass through the center of the pipe line 4 in section from the upper side to the lower side. However, the fin plates 14, 14' may extend from the upper side to the vicinity of the center of the pipe line 4.

As mentioned in the above, the inner diameter of the central portion of the flow passage or pipe line is made smaller than that of the inflow side portion of the flow passage or pipe line, the fluid flow is disturbed especially at the outer circumferential portion in the cross section of the pipe line by the step existing at the intermediate portion between the central portion and the inflow side portion, so that the flow rate distribution in cross section of the pipe line is made uniform. Therefore, accuracy of the flow rate detection performed with use of the fin plate can be enhanced, and especially the flow rate detection can be performed precisely under various environmental temperature conditions because the detection accuracy is not lowered if the temperature of the fluid is varied.

Figure 21:
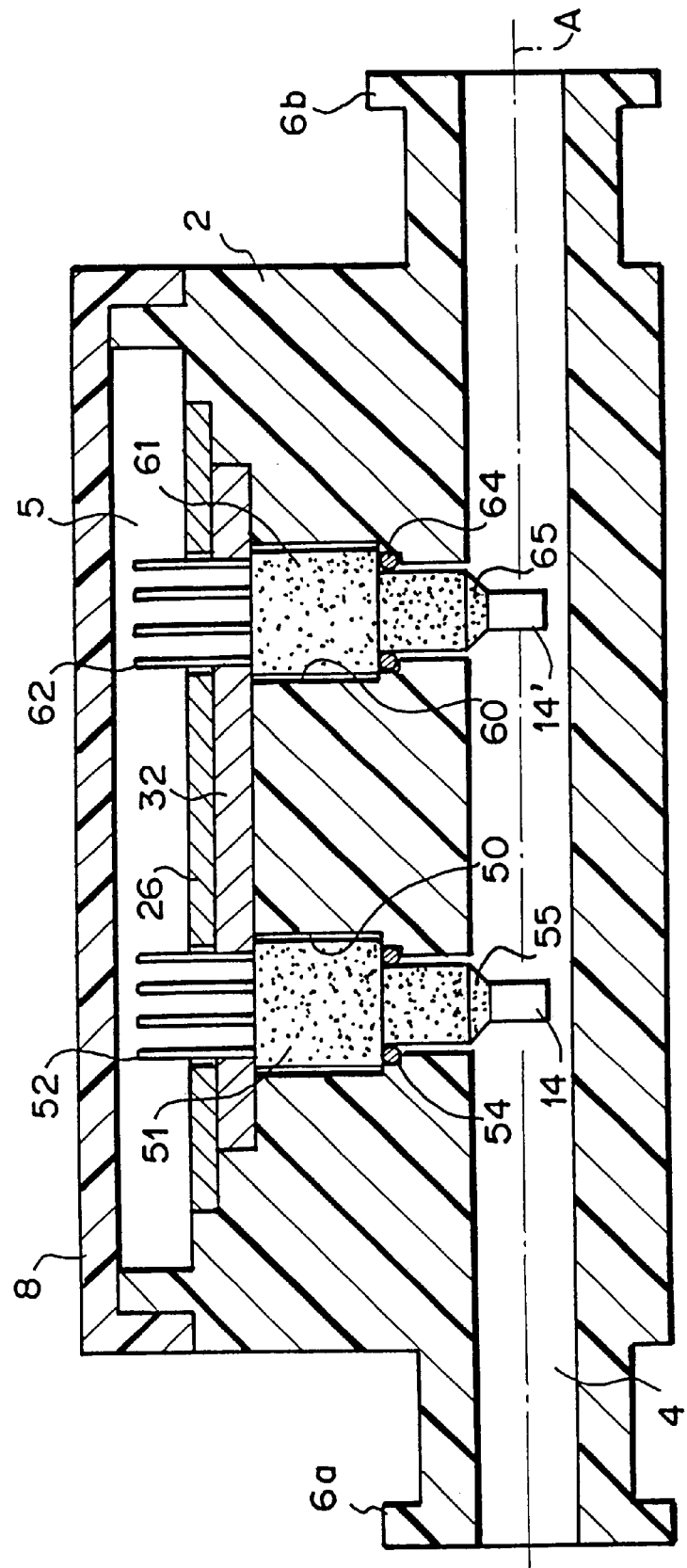
FIG. 21 is a cross-sectional view taken along a fluid-flowing pipe line showing an embodiment of a flow rate sensor according to the present invention.
Figure 22:
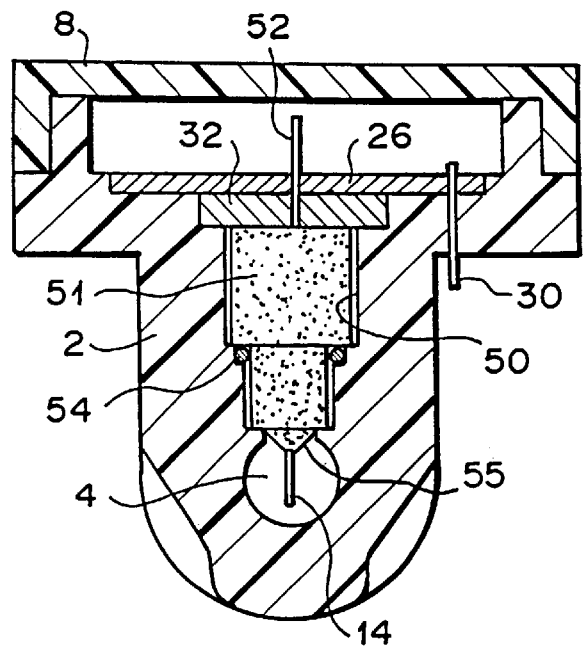
FIG. 22 is a cross-sectional view taken perpendicularly to the fluid-flowing pipe line showing the embodiment of the flow rate sensor according to the present invention.
Figure 23:
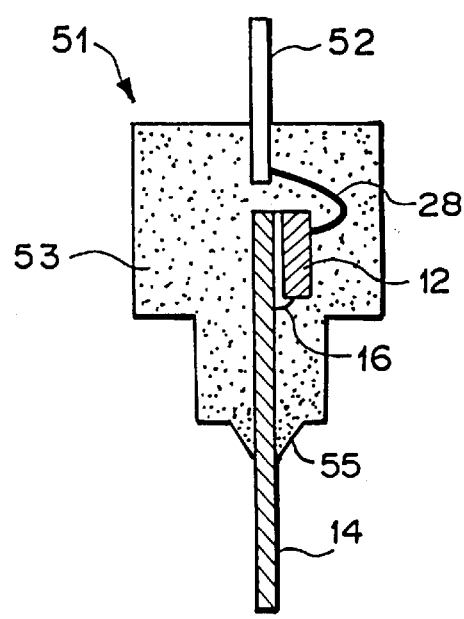
FIG. 23 is a cross-sectional view showing a flow rate detecting unit of the embodiment of the flow rate sensor according to the present invention.

FIGS. 21 and 22 are a cross-sectional view showing another embodiment of the flow rate sensor (flowmeter) according to the present invention. Especially, FIGS. 21 is a cross-sectional view taken along a fluid-flowing pipe line, and FIG. 22 is a cross-sectional view taken perpendicularly to the fluid-flowing pipe line. FIG. 23 is a cross-sectional view showing a flow rate detecting unit 51 of this embodiment. In these figures, members having the same functions as those shown in FIGS. 12 to 14 are designated by the same reference numerals as those in FIGS. 12 to 14. The flow rate sensor of this embodiment has the structure as explained with reference to FIGS. 15 and 16.

In this embodiment, as shown in FIGS. 21 to 23, especially in FIG. 23, the lower portion of the base portion 53 of the flow rate detecting unit 51 is projected into the pipe line 4 so as to form a protrusion serving as a heat insulation member 55. In the same manner, the lower portion of the base portion of the flow rate detecting unit 61 is projected into the pipe line 4 so as to form a protrusion serving as a heat insulation member 65. The heat insulation members 55 and 65 prevent the base of the extended portion of the fin plates 14, 14' into the pipe line 4 from being exposed to the fluid.

Figure 24:
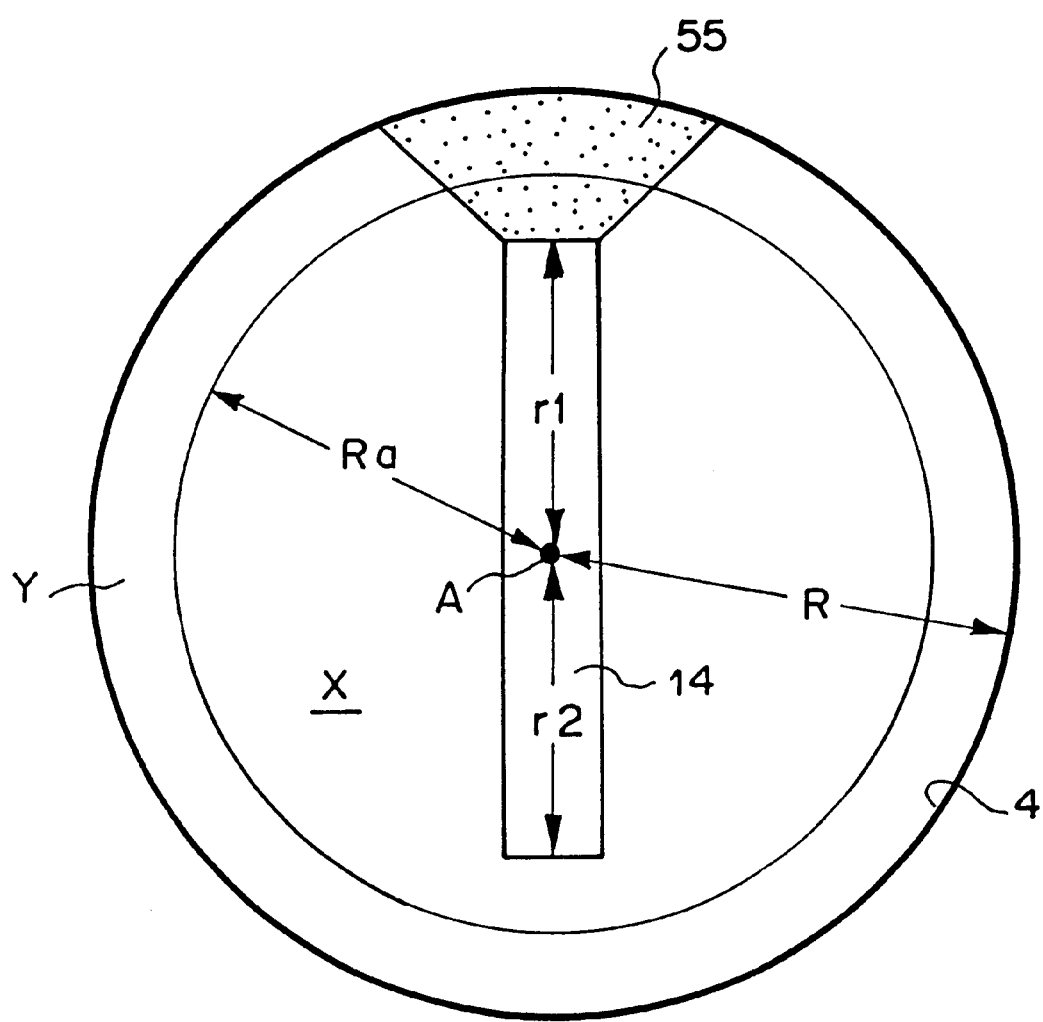
FIG. 24 is a schematic diagram showing a pipe line, fin plate extending thereinto and heat insulation member of the embodiment of the flow rate sensor according to the present invention.

FIG. 24 is a schematic diagram showing the pipe line 4, fin plate 14 extending thereinto and the heat insulation member 55 in cross section taken perpendicularly to a center line A of the pipe line 4 shown in FIG. 21. The base of the extended portion of the fin plate 14 into the pipe line 4 is sealed with the heat insulation member 55. That is, a portion of the fin plate 14 extending from the center line A to the position separated from the center line A toward the base side (upper side) by the interval r1 and another portion of the fin plate 14 extending from the center line A to the position separated from the center line A toward the tip end side (lower side) by the interval r2 (i.e. to the tip end of the fin plate 14) are exposed to the inside of the pipe line 4. The exposed portion of the fin plate 14 is positioned within a central area X extending from the center line A to the radius Ra, and is not positioned in a peripheral area Y located around the central area X. Here, the relationship "Ra=0.8R" is existing, wherein R denotes the inner radius of the pipe line 4. It is preferable to set r1 and r2 so as to realize the sum (r1+r2) of 0.7R or more. The reason is as follows: As the sum (r1+r2) becomes excessively smaller, the heat value transferred between the fin plate 14 and the fluid tends to be reduced to thereby cause the lowering of the flow rate detection efficiency.

As mentioned in the above, in this embodiment, the heat transfer between the fluid and the fin plate in the pipe line 4 is performed substantially only through the exposed portion of the fin plate in the central area X where the flow rate is efficiently detected because of relatively greater flow speed of the fluid, without using the peripheral area Y where the sensitivity of the flow rate detection is low because of relatively smaller flow rate of the fluid.

Furthermore, the shearing stress generated in the fluid on the basis of the contact friction of the fluid with the inner surface of the pipe line during fluid-flowing is greater in the peripheral area Y, and minute eddy is randomly generated in the peripheral area Y during fluid-flowing because the roughness of the inner surface of the pipe line is generally not zero. Therefore, the stable flow rate output can be obtained by performing the heat transfer for flow rate detection only in the central area X without using the peripheral area Y where the fluid-flowing tends to become unstable.

In the above, there is explained the structure for flow rate detection in which the base of the extended portion of the fin plate 14 into the pipe line 4 is sealed with the heat insulation member 55. The structure for temperature detection in which the base of the extended portion of the fin plate 14' into the pipe line 4 is sealed with the heat insulation member 65 is constituted in the same manner as the structure for flow rate detection. With such a structure, the temperature of the fluid in the central area X through which major part of the fluid flows can be precisely detected, so that the temperature compensation of the fluid can be performed precisely in the flow rate detection performed on the basis of the heat transfer between the fin plate 14 and the fluid in the central area X.

Figure 25:
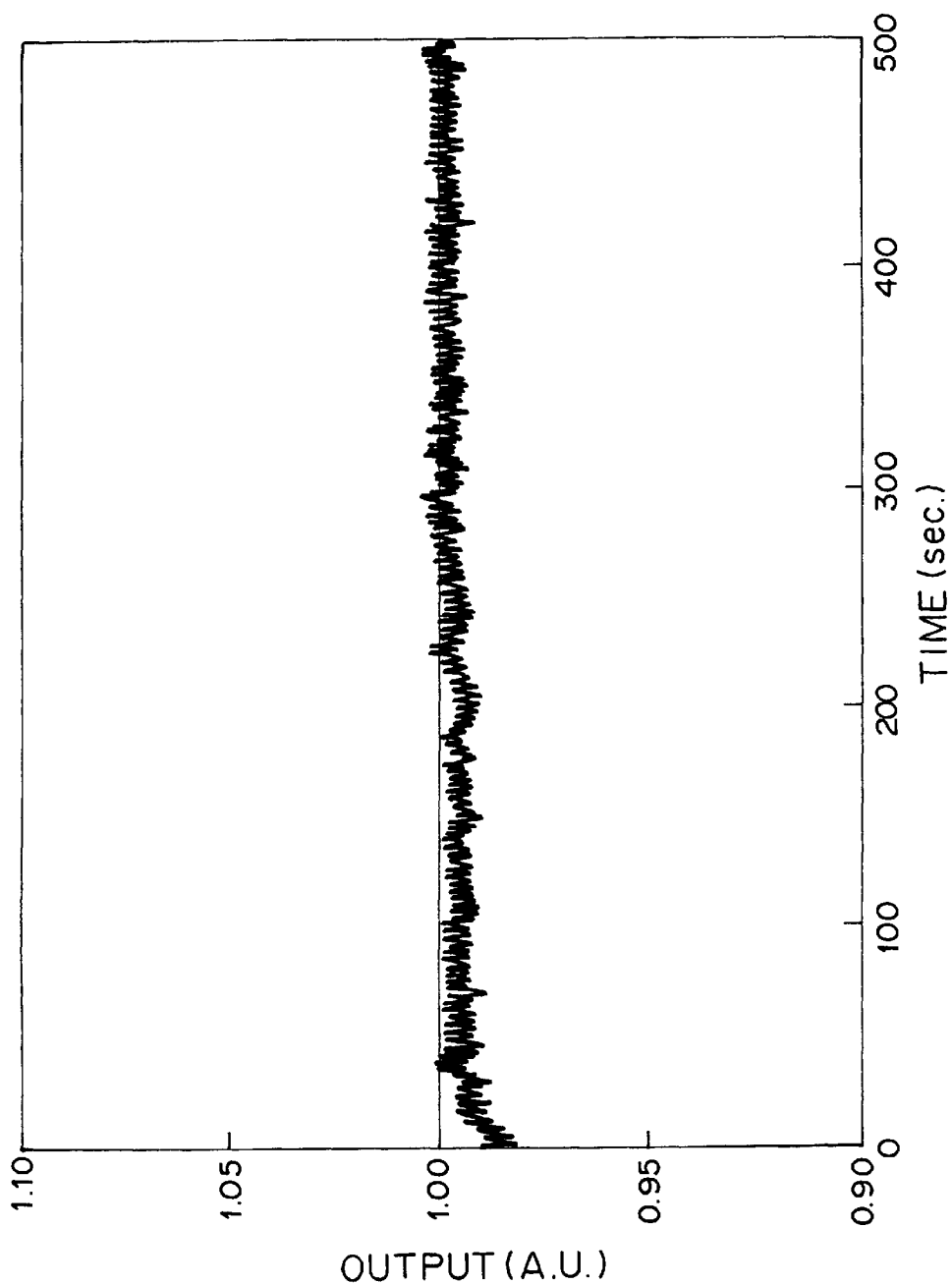
FIG. 25 is a graph showing detection result of variation of output voltage obtained in the embodiment of the flow rate sensor according to the present invention.
Figure 26:
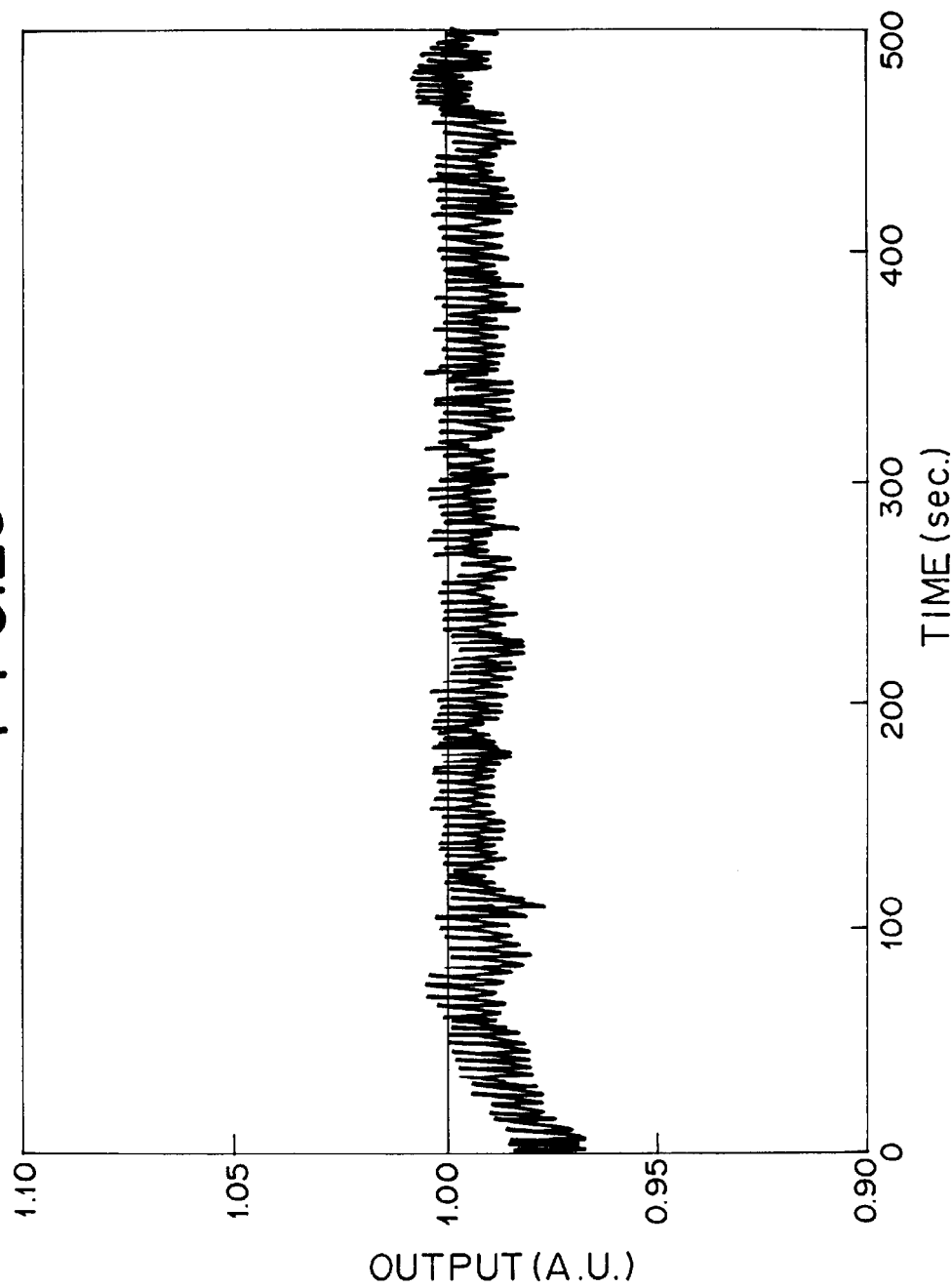
FIG. 26 is a graph showing detection result of variation of output voltage obtained in comparative flow rate sensor.

FIG. 25 is a graph showing detection result of variation of output voltage obtained in the flow rate sensor of the above embodiment, wherein kerosene was used as the fluid, the inner diameter (2R) was set to 4 mmφ, the relationship "r1=r2=0.5R" was existing, and the flow rate was varied from 20 cc/min to 80 cc/min and thereafter the variation of output voltage was detected. On the other hand, FIG. 26 is a graph showing detection result of variation of output voltage obtained in the flow rate sensor which has the same structure as those used in obtaining FIG. 25 except that no heat insulation member was used (i.e., r1=R, r2=0.5R), wherein the variation of output voltage was detected in the same manner as the case of FIG. 25. The amplitude of the flow rate output voltage in FIG. 25 is smaller (by about ⅓) than that of FIG. 26, and therefore the case of FIG. 25 is small in error as compared with the case of FIG. 26.

According to this embodiment, the flow rate of the fluid in the pipe line 4 can be detected accurately and stably.

As explained in the above, in the flow rate sensor according to the present invention, since the flow rate detecting heat transfer member is exposed into the inside of the pipe line only in the central area located from the center line of the pipe line to the radial position of 80% of the radial interval between the center line and the inner surface of the pipe line or less, the heat transfer between the fluid and the flow rate detecting heat transfer member is performed in the central area where the flow rate is efficiently detected because of relatively greater flow speed of the fluid, and the fluid flow is relatively stable. Therefore, the flow rate detection can be performed precisely and stably under various environmental temperature conditions.

INDUSTRIAL APPLICABILITY

As described above, according to the strainer integrated flowmeter of the present invention, the foreign matters hardly invade the flowmeter, and the flow rate of the fluid flowing through the flow passage can be detected accurately over long time.

In addition, according to the flow rate sensor of the present invention, the flow rate detection can be performed precisely and stably under various environmental temperature conditions.

Reference is made to co-pending U.S. patent application Ser. No. 09/554,917 filed May 22, 2000.

What is claimed is:

1. A strainer integrated flowmeter comprising:

a strainer section provided with a housing having a flow passage formed therein, a filter member and a filter member insertion cylinder; and a flowmeter section provided with a housing having a flow passage formed therein and a flow rate sensor, wherein said housing for the strainer section and said housing of the flowmeter section are integrated, and said flowmeter section is disposed downstream said strainer section, wherein said flow rate sensor comprises a flow rate detector having a heating element and a temperature sensing element disposed so as to be affected by the effect of the heating of said heating element; a fin plate through which heat is transferred to or from a fluid; and an output terminal for outputting a voltage value corresponding to a flow rate of the fluid, said flow rate detector being fixed to the fin plate at a position outside the flow passage, and, said flow rate detector, a portion of said fin plate to which said flow rate detector is fixed and a portion of said output terminal are sealed with molding, and wherein said housing of the flowmeter section has a sensor insertion hole communicating with the flow passage, and said molding of the flow rate sensor is inserted into said sensor insertion hole so that another portion of said fin plate extending from said molding is located at an inside of the flow passage.

2. The strainer integrated flowmeter as claimed in claim 1, wherein a vent hole is formed in said integrated housing so as to be in communication with said flow passage formed in said integrated housing.

3. The strainer integrated flowmeter as claimed in claim 1, wherein said flowmeter section is provided with a display portion for indicating a flow rate value, an operating portion for supplying electric power and detecting a flow rate, and an electric circuit for driving said display portion to indicate said flow rate value detected by said flow rate sensor.

4. The strainer integrated flowmeter as claimed in claim 3, wherein said electric circuit comprises said temperature sensing element of the flow rate sensor, a temperature sensing element of a temperature sensor, and a bridge circuit which outputs a voltage difference between voltage values obtained at two points thereof corresponding to said flow rate of the fluid, said bridge circuit comprising said temperature sensing element of said flow rate sensor and said temperature sensing element of said temperature sensor.

5. The strainer integrated flowmeter as claimed in claim 4, wherein said electric circuit further comprises a V/F conversion circuit for converting said voltage difference corresponding to said flow rate of the fluid to a pulse signal having corresponding frequency, a counter for counting number of pulse of said pulse signal, and a microcomputer for converting output of said counter to a flow rate value corresponding to said frequency.

6. The strainer integrated flowmeter as claimed in claim 1, wherein said flowmeter section is provided with a temperature sensor for detecting a temperature of fluid.

7. The strainer integrated flowmeter as claimed in claim 6, wherein said temperature sensor comprises a temperature detector having a temperature sensing element formed on a substrate; a temperature sensor fin plate through which heat is transferred to or from said fluid; and a temperature sensor output terminal for outputting a voltage value corresponding to said temperature, and, said temperature detector, a portion of said temperature sensor fin plate and a portion of said temperature sensor output terminal are sealed with molding.

8. A flow rate sensor comprising:
a casing;
a flow rate detector having a heating function and temperature sensing function;
a fluid-flowing pipe line for a fluid to be detected, the pipe line being formed through the casing; and
a flow rate detecting heat transfer member disposed so as to be affected by a heat generated in said flow rate detector and extend into the inside of said pipe line, said flow rate detector being disposed outside of the pipeline, wherein temperature sensing which is affected by a heat absorption effect of the fluid due to the heat through said flow rate detecting heat transfer member is executed in said flow rate detector, and a flow rate of said fluid in said pipe line is detected on the basis of the result of the temperature sensing,
wherein said pipe line has a fluid inflow side portion, a fluid outflow side portion and a center portion positioned between said fluid inflow side portion and fluid outflow side portion, said flow rate detecting heat transfer member extends into the inside of said pipe line at said center portion, and an inner diameter of said center portion is smaller than that of said fluid inflow side portion,
wherein said flow rate detector and a portion of said flow rate detecting heat transfer member to which said flow rate detector is thermally connected are sealed with a base portion, and
wherein said casing has a retaining portion, and said base portion is retained within said retaining portion so that another portion of said flow rate detecting heat transfer member extending from said base portion is located at the inside of the pipe line at said center portion.

9. The flow rate sensor as claimed in claim 8, wherein the inner diameter of said center portion is 50–80% of the inner diameter of said fluid inflow side portion.

10. The flow rate sensor as claimed in claim 8, wherein the inner diameter of said fluid outflow side portion is substantially equal to the inner diameter of said fluid inflow side portion.

11. The flow rate sensor as claimed in claim 8, wherein an intermediate portion is formed between said center portion and said fluid inflow side portion, the intermediate portion having a continuously varying inner diameter and a length of a half or less of a difference between the inner diameter of said fluid inflow side portion and the inner diameter of said center portion.

12. The flow rate sensor as claimed in claim 8, wherein said flow rate detecting heat transfer member is disposed at a position separated from a fluid inflow side edge of said center portion by 4 times or less of the inner diameter of said center portion.

13. The flow rate sensor as claimed in claim 8, wherein said flow rate detector comprises a thin-film heating element and a flow rate detecting thin-film temperature sensing element disposed so as to be affected by the effect of the heating of said thin-film heating element, said thin-film heating element and said flow rate detecting thin-film temperature sensing element being formed on said flow rate detecting heat transfer member at an outside of said pipe line.

14. The flow rate sensor as claimed in claim 8, wherein said flow rate detecting heat transfer member has a shape of plate and is arranged in parallel to a fluid-flowing direction in said pipe line.

15. The flow rate sensor as claimed in claim 8, further comprising a fluid temperature detector for use in thermal compensation of flow rate detection, and a fluid temperature detecting heat transfer member extending into the inside of said pipe line, wherein said fluid temperature detector and said fluid temperature detecting heat transfer member are thermally connected to each other.

16. The flow rate sensor as claimed in claim 15, wherein said fluid temperature detecting heat transfer member is disposed in said center portion of the pipe line at a fluid outflow side of said flow rate detecting heat transfer member.

17. The flow rate sensor as claimed in claim 15, wherein said fluid temperature detecting heat transfer member has a shape of plate and is arranged in parallel to a fluid-flowing direction in said pipe line.

18. A flow rate sensor comprising:
a casing;
a flow rate detector having a heating function and temperature sensing function;
a fluid-flowing pipe line for a fluid to be detected, the pipe line being formed through the casing; and
a flow rate detecting heat transfer member disposed so as to be affected by a heat generated in said flow rate detector and extend into the inside of said pipe line, said flow rate detector being disposed outside of the pipeline, wherein temperature sensing which is affected by a heat absorption effect of the fluid due to the heat through said flow rate detecting heat transfer member is executed in said flow rate detector, and a flow rate of said fluid in said pipe line is detected on the basis of result of the temperature sensing,
wherein said flow rate detector and a portion of said flow rate detecting heat transfer member to which said flow rate detector is thermally connected are sealed with a base portion, said casing has a retaining portion, said base portion is retained within said retaining portion, and, another portion of said flow rate detecting heat transfer member extending from said base portion is exposed to an inside of said pipe line only at a central area located from a center line of said pipe line to a radial position of 80% or less of a radial interval between the center line and an inner surface of said pipe line.

19. The flow rate sensor as claimed in claim 18, wherein said flow rate detecting heat transfer member extends into said pipe line in a radial direction thereof so that a tip end thereof is positioned in said central area, and a base of a portion of the flow rate detecting heat transfer member which is disposed in the pipe line but outside the central area is sealed with a heat insulation member.

20. The flow rate sensor as claimed in claim 19, wherein said flow rate detector and a portion of said flow rate detecting heat transfer member thermally connected to said flow rate detector are accommodated within a base portion having heat insulation property, and said heat insulation member is constituted by a part of said base portion.

21. The flow rate sensor as claimed in claim 20, wherein said base portion and said heat insulation member are made of synthetic resin.

22. The flow rate sensor as claimed in claim 18, wherein said flow rate detector comprises a thin-film heating element and a flow rate detecting thin-film temperature sensing element disposed so as to be affected by the effect of the heating of said thin-film heating element, said thin-film heating element and a flow rate detecting thin-film temperature sensing element being formed on said flow rate detecting heat transfer member at an outside of said pipe line.

23. The flow rate sensor as claimed in claim 18, wherein said flow rate detecting heat transfer member has a shape of plate and is arranged in said pipe line along a direction thereof.

24. The flow rate sensor as claimed in claim 18, further comprising a fluid temperature detector for use in thermal compensation of flow rate detection, and a fluid temperature detecting heat transfer member extending into the inside of said pipe line, wherein said fluid temperature detector and said fluid temperature detecting heat transfer member are thermally connected to each other.

25. The flow rate sensor as claimed in claim 24, wherein said temperature detecting heat transfer member is exposed to the inside of the pipe line only at said central area.

26. The flow rate sensor as claimed in claim 24, wherein said temperature detecting heat transfer member extends into said pipe line in a radial direction thereof so that a tip end thereof is positioned in said central area, and a base of a portion of the temperature detecting heat transfer member which is disposed in the pipe line but outside the central area is sealed with a heat insulation member.

27. The flow rate sensor as claimed in claim 26, wherein said temperature detector and a portion of said temperature detecting heat transfer member thermally connected to said temperature detector are accommodated within a base portion having heat insulation property, and said heat insulation member is constituted by a part of said base portion.

28. The flow rate sensor as claimed in claim 24, wherein said temperature detecting heat transfer member has a shape of plate and is arranged in said pipe line along a direction thereof.

* * * * *